United States Patent
Kang et al.

(10) Patent No.: US 11,039,056 B2
(45) Date of Patent: Jun. 15, 2021

(54) IMAGE SENSOR FOR GENERATING DEPTH DATA BY A PATH DIFFERENCE OF LIGHT GENERATED THROUGH MICRO LENS COVERING A PLURALITY OF SUB-PIXELS AND ELECTRONIC DEVICE INCLUDING THE IMAGE SENSOR

(71) Applicant: Samsung Electronics Co., Ltd., Suwon-si (KR)

(72) Inventors: Hwayong Kang, Suwon-si (KR); Jonghun Won, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 16/704,621

(22) Filed: Dec. 5, 2019

(65) Prior Publication Data

US 2020/0186723 A1 Jun. 11, 2020

(30) Foreign Application Priority Data

Dec. 6, 2018 (KR) ........................ 10-2018-0156107

(51) Int. Cl.
*H04N 5/232* (2006.01)

(52) U.S. Cl.
CPC ... *H04N 5/232122* (2018.08); *H04N 5/23212* (2013.01)

(58) Field of Classification Search
CPC ......... H04N 5/23212; H04N 5/232122; H04N 5/232125; H04N 5/347; H04N 9/07
See application file for complete search history.

(56) References Cited

U.S. PATENT DOCUMENTS

| | | |
|---|---|---|
| 9,748,288 B2 | 8/2017 | Baek |
| 9,786,714 B2 | 10/2017 | Tayanaka |
| 9,804,357 B2 | 10/2017 | Galor Gluskin et al. |
| 10,044,959 B2 | 8/2018 | Gluskin |
| 10,115,753 B2 | 10/2018 | Baek |
| 10,128,284 B2 | 11/2018 | Gluskin |
| 10,284,799 B2 | 5/2019 | Yokogawa et al. |
| 10,341,620 B2 | 7/2019 | Murata |

(Continued)

FOREIGN PATENT DOCUMENTS

JP 2015-153975 A 8/2015

OTHER PUBLICATIONS

International Search Report dated Apr. 2, 2020; International Application No. PCT/KR2019/017163.

*Primary Examiner* — Amy R Hsu
(74) *Attorney, Agent, or Firm* — Jefferson IP Law, LLP

(57) ABSTRACT

An electronic device is provided. The electronic device includes a camera module including a lens assembly and an image sensor, a display, and a processor. At least one pixel of the image sensor includes a first sub-pixel, a second sub-pixel, a third sub-pixel, and a fourth sub-pixel. The first sub-pixel may be covered by a first micro lens, the second sub-pixel may be covered by a second micro lens, and the third sub-pixel and the fourth sub-pixel may be covered by a third micro lens. The processor obtains a light reflected from an external object, generates depth data, generates pixel data generates an image based on the pixel data, outputs the image, and moves one or more lenses based on the depth data.

23 Claims, 12 Drawing Sheets

(56) References Cited

U.S. PATENT DOCUMENTS

| | | |
|---|---|---|
| 10,484,627 B2 | 11/2019 | Zhou |
| 10,560,669 B2 | 2/2020 | Murata |
| 2013/0329120 A1* | 12/2013 | Hiasa ................. H04N 5/23229 348/345 |
| 2015/0062391 A1 | 3/2015 | Murata |
| 2015/0236066 A1* | 8/2015 | Tayanaka .......... H01L 27/14685 257/432 |
| 2016/0240571 A1 | 8/2016 | Baek |
| 2017/0090149 A1* | 3/2017 | Galor Gluskin ....... G02B 7/285 |
| 2017/0094210 A1 | 3/2017 | Gluskin |
| 2017/0366770 A1 | 12/2017 | Yokogawa et al. |
| 2017/0373105 A1* | 12/2017 | Galor Gluskin ... H04N 5/36961 |
| 2018/0109768 A1 | 4/2018 | Murata |
| 2018/0316878 A1* | 11/2018 | Zhou .................... H04N 5/3696 |
| 2019/0174103 A1 | 6/2019 | Murata |
| 2019/0199950 A1 | 6/2019 | Yokogawa et al. |
| 2020/0137361 A1 | 4/2020 | Murata |
| 2020/0145595 A1 | 5/2020 | Yokogawa et al. |
| 2020/0404185 A1* | 12/2020 | Noh .................... H04N 5/2254 |

\* cited by examiner

FIG.5A

IMAGE SENSOR FOR GENERATING DEPTH DATA BY A PATH DIFFERENCE OF LIGHT GENERATED THROUGH MICRO LENS COVERING A PLURALITY OF SUB-PIXELS AND ELECTRONIC DEVICE INCLUDING THE IMAGE SENSOR

CROSS-REFERENCE TO RELATED APPLICATION(S)

This application is based on and claims priority under 35 U.S.C. § 119(a) of a Korean patent application number 10-2018-0156107, filed on Dec. 6, 2018, in the Korean Intellectual Property Office, the disclosure of which is incorporated by reference herein in its entirety.

BACKGROUND

1. Field

The disclosure relates to a technology for generating depth data by using an image sensor. More particularly, the disclosure relates to an image sensor that generates depth data by a path difference of light generated through micro lens covering a plurality of sub-pixels.

2. Description of Related Art

An image sensor may include pixels for detection of a phase difference. The image sensor may generate phase difference information by using the pixels.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an image sensor that designates some (e.g., 1%) of all the pixels for detecting a phase difference and generates depth data. However, data that is obtained from the designated pixels may be used only to generate depth data. In other words, the data obtained from the designated pixels may not be used as image data.

In a dual pixel or dual photodiode (2PD) image sensor, each pixel includes two photodetectors, with one color filter covering the two photodetectors, and at least one micro lens covering the color filter. The 2PD image sensor generates image data as well as depth data, by using data obtained from two photodetectors.

For example, the image sensor may generate depth data based on a difference in an incident light quantity between the two photodetectors, may add the incident light quantities of the two photodetectors, and may generate image data based on the added incident light quantity. The 2PD image sensor may generate an image of a resolution corresponding to the half of the total number of photodetectors. For example, the 2PD image sensor including 24M photodetectors may generate image data of a 24M resolution.

Aspects of the disclosure are to address at least the above-mentioned problems and/or disadvantages and to provide at least the advantages described below. Accordingly, an aspect of the disclosure is to provide an image sensor, a camera module, and an electronic device, which include a phase difference detecting pixel capable of generating image data of a resolution corresponding to the total number of photodetectors (sub-pixels).

In accordance with an aspect of the disclosure, an image sensor is provided. The image sensor includes at least one pixel that includes a first sub-pixel, a second sub-pixel, a third sub-pixel, and a fourth sub-pixel covered by a color filter and includes a first micro lens covering the first sub-pixel, a second micro lens covering the second sub-pixel, and a third micro lens covering the third sub-pixel and the fourth sub-pixel, and a control circuit electrically connected with the at least one pixel. The control circuit may obtain a light of an external object by using the at least one pixel, may generate depth data associated with the external object, by using data obtained from the third sub-pixel and the fourth sub-pixel through the third micro lens, may generate pixel data on the at least one pixel by processing data obtained from the first sub-pixel, the second sub-pixel, the third sub-pixel, and the fourth sub-pixel with regard to the light, and may transmit the pixel data and the depth data to an external processor.

In accordance with another aspect of the disclosure, an image sensor is provided. The image sensor includes a plurality of pixels that are arranged depending on a specified channel pattern, wherein each of the plurality of pixels includes one color filter, and a first sub-pixel, a second sub-pixel, a third sub-pixel, and a fourth sub-pixel covered by the color filter, and a control circuit configured to control the plurality of pixels. Each of at least some pixels of the plurality of pixels may further include a first micro lens covering the first sub-pixel, a second micro lens covering the second sub-pixel, and a third micro lens covering the third sub-pixel and the fourth sub-pixel. The control circuit may obtain a light of an external object by using the plurality of pixels, may generate depth data associated with the external object, by using data obtained from the third sub-pixel and the fourth sub-pixel included in each of the at least some pixels, may generate pixel data on each of the pixels by using data obtained from the first to fourth sub-pixels included in each of the plurality of pixels, and may transmit the pixel data and the depth data to an external processor.

In accordance with another aspect of the disclosure, an electronic device is provided. The electronic device includes a camera module, wherein the camera module includes a lens assembly including one or more lenses and an image sensor including at least one pixel, a display, and a processor electrically connected with the display and the camera module. The at least one pixel may include a first sub-pixel, a second sub-pixel, a third sub-pixel, and a fourth sub-pixel covered by one color filter and may include a first micro lens covering the first sub-pixel, a second micro lens covering the second sub-pixel, and a third micro lens covering the third sub-pixel and the fourth sub-pixel. The processor may obtain a light of an external object passing through the one or more lenses by using the at least one pixel, may generate depth data associated with the external object, based on data obtained from the third sub-pixel and the fourth sub-pixel through the third micro lens, by using the image sensor, may generate pixel data on the at least one pixel based on data obtained from the first sub-pixel, the second sub-pixel, the third sub-pixel, and the fourth sub-pixel, by using the image sensor, may display an image generated based on the pixel data through the display, and may adjust a focus on the external object by moving the one or more lenses based on the depth data.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5A illustrates binning and rearrangement of pixel data according to an embodiment of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

Figure 1:
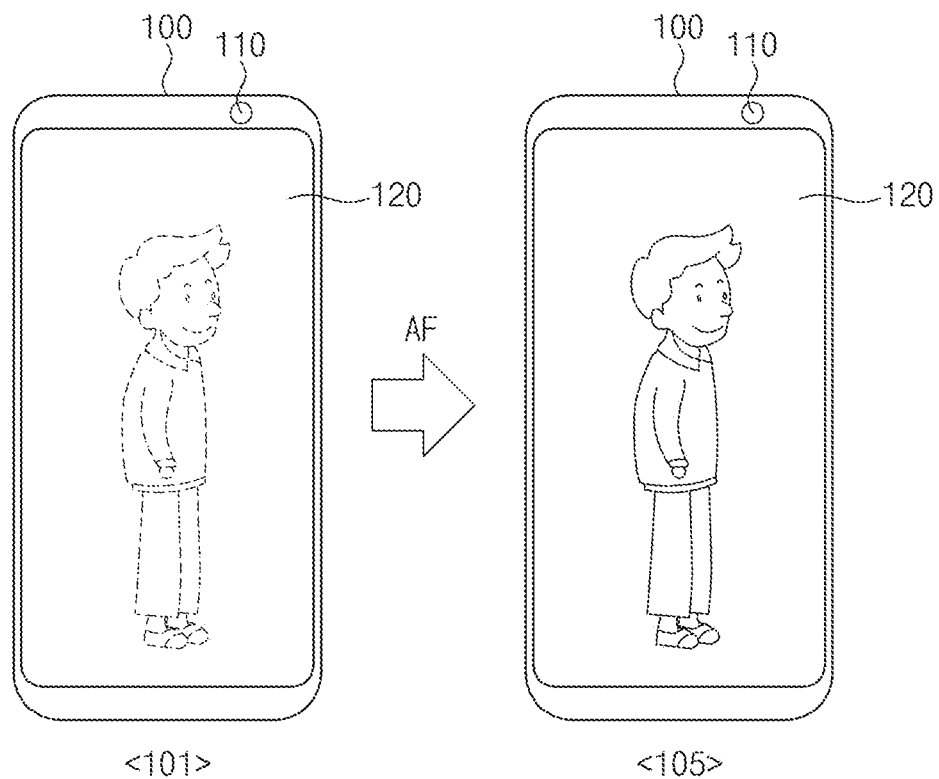
FIG. 1 illustrates an electronic device capable of adjusting a focus according to an embodiment of the disclosure.

FIG. 1 illustrates an electronic device capable of adjusting a focus according to an embodiment of the disclosure.

Referring to FIG. 1, an electronic device 100 according to an embodiment may generate a preview image based on image data obtained by using a camera module 110 and may output the generated preview image to a display 120. The camera module 110 may include, for example, a lens assembly including one or more lenses and an image sensor. Each of pixels of the image sensor may include a plurality of sub-pixels. Some sub-pixels of the plurality of sub-pixels may be sub-pixels sharing a micro lens, and the remaining sub-pixels may be sub-pixels not sharing the micro lens.

In screen 101, the electronic device 100 may generate phase difference data (or depth data) by a path difference of a light passing through the micro lens of sub-pixels that share the micro lens.

In screen 105, in operation AF, the electronic device 100 may adjust a focus on an external object by moving the one or more lenses included in the camera module 110 based on the generated phase difference data. As such, the electronic device 100 may display a preview image focusing on the external object to the display 120.

An example is illustrated in FIG. 1 as the camera module 110 is a front camera of the electronic device 100. However, the disclosure is not limited thereto. For example, the camera module 110 may be disposed on at least one of a back surface or a side surface of the electronic device 100.

Figure 2A:
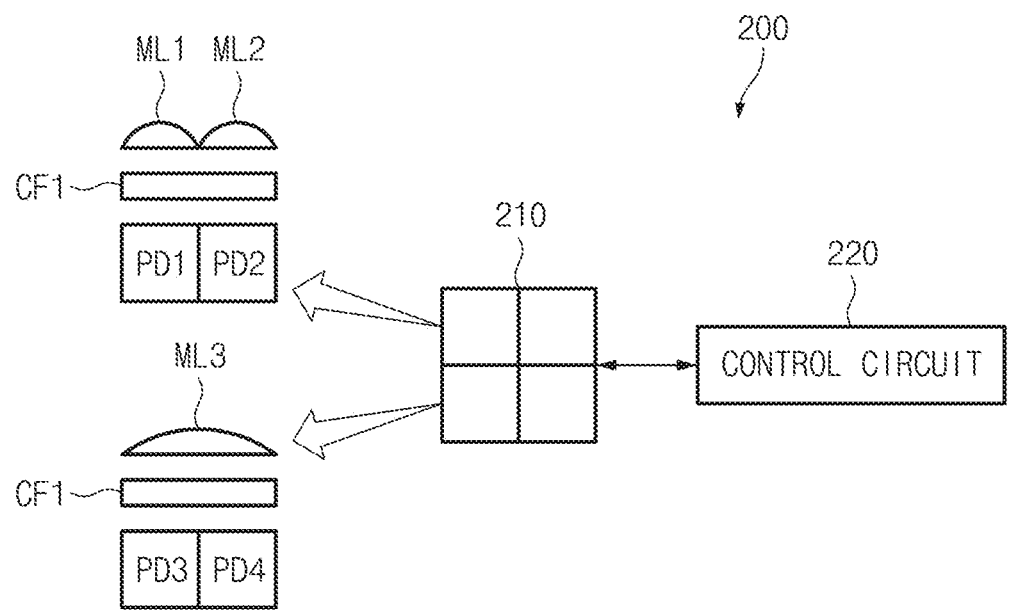
FIG. 2A illustrates a configuration diagram of an image sensor including one pixel according to an embodiment of the disclosure.

FIG. 2A illustrates a configuration diagram of an image sensor including one pixel according to an embodiment of the disclosure.

Referring to FIG. 2A, according to an embodiment, an image sensor 200 may include at least one pixel 210 and a control circuit 220. For convenience of description, an example is illustrated in FIG. 2A as the image sensor 200 includes one pixel. However, the disclosure is not limited thereto. For example, the image sensor 200 may include a plurality of pixels that are formed to have a specified channel pattern.

According to an embodiment, the at least one pixel 210 may include a first micro lens ML1, a second micro lens ML2, a third micro lens ML3, a color filter CF1, a first sub-pixel PD1, a second sub-pixel PD2, a third sub-pixel PD3, and a fourth sub-pixel PD4.

The first micro lens ML1 may cover the first sub-pixel PD1 and may adjust a path of an incident light such that a light incident from the outside arrives at the first sub-pixel PD1. The second micro lens ML2 may cover the second sub-pixel PD2 and may adjust a path of an incident light such that a light incident from the outside arrives at the second sub-pixel PD2. The third micro lens ML3 may cover the third sub-pixel PD3 and the fourth sub-pixel PD4 and may adjust a path of an incident light such that a light incident from the outside arrives at the third sub-pixel PD3 and the fourth sub-pixel PD4.

The color filter CF1 may be disposed between the first to third micro lenses ML1, ML2, and ML3 and the first to fourth sub-pixels PD1, PD2, PD3, and PD4 and may transmit a light in a specified wavelength range (e.g., a wavelength range corresponding to a green color). The color filter CF1 may block a light being out of the specified wavelength range such that only a light, which belongs to the specified wavelength range, of the light passing through the first to third micro lenses ML1, ML2, and ML3 arrives at the first to fourth sub-pixels PD1, PD2, PD3, and PD4.

The first sub-pixel PD1 may include a first photodetector (e.g., a photo diode) that is able to detect a light passing through the first micro lens ML1 and the color filter CF1. The second sub-pixel PD2 may include a second photodetector (e.g., a photo diode) that is able to detect a light passing through the second micro lens ML2 and the color filter CF1. The third sub-pixel PD3 may include a third photodetector (e.g., a photo diode) that is able to detect a light passing through the third micro lens ML3 and the color filter CF1. The fourth sub-pixel PD4 may include a fourth photodetector (e.g., a photo diode) that is able to detect a light passing through the third micro lens ML3 and the color filter CF1. Due to a characteristic of the third micro lens ML3, a path difference may occur between lights incident onto the third sub-pixel PD3 and the fourth sub-pixel PD4 through the third micro lens ML3. The third sub-pixel PD3 and the fourth sub-pixel PD4 may be disposed to be adjacent to each other in a transverse direction, a longitudinal direction, or a diagonal direction of a pixel, in which the third sub-pixel PD3 and the fourth sub-pixel PD4 are included, of the at least one pixel 210.

The control circuit 220 may generate phase difference data (or depth data) by using data (e.g., an incident light quantity) obtained from the third sub-pixel PD3 and the fourth sub-pixel PD4. For example, the control circuit 220 may verify a difference between data obtained from the third sub-pixel PD3 and data obtained from the fourth sub-pixel PD4 and may generate phase difference data corresponding to the verified difference.

The control circuit 220 may process the pieces of data respectively obtained from the first sub-pixel PD1, the second sub-pixel PD2, the third sub-pixel PD3, and the fourth sub-pixel PD4 and may generate pixel data on the at least one pixel 210. A scheme in which the control circuit 220 processes obtained data may vary depending on an output mode of the at least one pixel 210 (or the image sensor 200). According to an embodiment, in a first output mode, the control circuit 220 may generate the pixel data on the at least one pixel 210, by performing binning (e.g., adding or averaging) on the data obtained from the first sub-pixel PD1, the second sub-pixel PD2, the third sub-pixel PD3, and the fourth sub-pixel PD4. In this case, one pixel data (e.g., pixel data of a pixel unit) may be generated with respect to one pixel (e.g., 210). According to an embodiment, in a second output mode, the control circuit 220 may generate four pixel data (e.g., pixel data of a sub-pixel unit) on the at least one pixel 210 by using the data obtained from the first sub-pixel PD1, the second sub-pixel PD2, the third sub-pixel PD3, and the fourth sub-pixel PD4.

According to various embodiments, the data obtained from the third sub-pixel PD3 and the fourth sub-pixel PD4 may have a phase difference due to the third micro lens ML3 and thus may be different from actual image data. To solve an error of image data due to the difference between the obtained data and the actual image data, the control circuit 220 may generate phase difference data based on the data obtained from the third sub-pixel PD3 and the fourth sub-pixel PD4 and may restore the data obtained from the third sub-pixel PD3 and the fourth sub-pixel PD4 based on the data obtained from the first and second sub-pixels PD1 and PD2.

For example, the control circuit 220 may restore data on the third sub-pixel PD3 and data on the fourth sub-pixel PD4 by summing the data obtained from the third sub-pixel PD3 and the fourth sub-pixel PD4 and dividing the summed data by a ratio of the data obtained from the first sub-pixel PD1 to the data obtained from the second sub-pixel PD2. For another example, the data obtained from the first sub-pixel PD1 and the data obtained from the second sub-pixel PD2 may be 1 and 3, respectively, and the data obtained from the third sub-pixel PD3 and the data obtained from the fourth sub-pixel PD4 may be 4 and 4, respectively. In this case, the control circuit 220 may generate restored pixel data of 2 (=8*(¼)) with regard to the third sub-pixel PD3 and restored pixel data of 6 (=8*(¾)) with regard to the fourth sub-pixel PD4, by dividing "8" being a result of summing the data obtained from the third sub-pixel PD3 and the fourth sub-pixel PD4 by "1:3" being a ratio of the data obtained from the first sub-pixel PD1 to the data obtained from the second sub-pixel PD2.

The control circuit 220 may transmit the generated phase difference data and the pixel data to an external processor. In the second output mode, the control circuit 220 may rearrange the pixel data and may transmit the rearranged pixel data to the external processor.

According to various embodiments, the at least one pixel 210 may include sub-pixels, the number of which exceeds "4". In this case, the first sub-pixel PD1 and the second sub-pixel PD2 that are used for restoration of the third sub-pixel PD3 and the fourth sub-pixel PD4 may be sub-pixels the closest to the third sub-pixel PD3 and the fourth sub-pixel PD4. For example, the at least one pixel 210 may include a 3×3 array of sub-pixels (a total of 9 sub-pixels), and the third sub-pixel PD3 and the fourth sub-pixel PD4 may be sub-pixels at positions (1, 1) and (1, 2) of the 3×3 array. In this case, the first sub-pixel PD1 and the second sub-pixel PD2 may be sub-pixels at positions (2, 1) and (2, 2).

According to various embodiments, the at least one pixel 210 may include a plurality of pixels. In this case, a plurality of sub-pixels included in each pixel (e.g., 210) may be arranged to be contiguous to each other in at least one of a transverse direction, a longitudinal direction, or a diagonal direction of each pixel 210. Also, the plurality of pixels may be arranged along a specified channel pattern.

According the above embodiment, the image sensor 200 may detect phase difference data by using the third sub-pixel PD3 and the fourth sub-pixel PD4 for phase difference detection and may also generate pixel data on the third sub-pixel PD3 and pixel data on the fourth sub-pixel PD4.

Figure 2B:
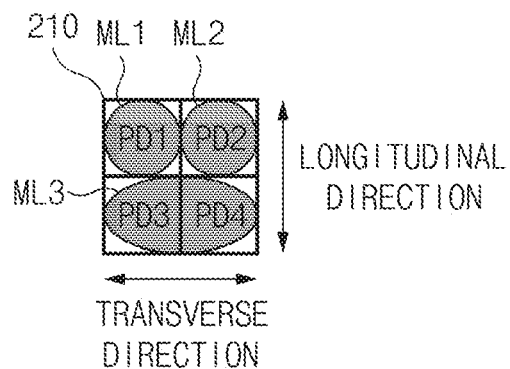
FIGS. 2B, 2C and 2D illustrate array structures of sub-pixels included in at least one pixel according to various embodiments of the disclosure.
Figure 2C:
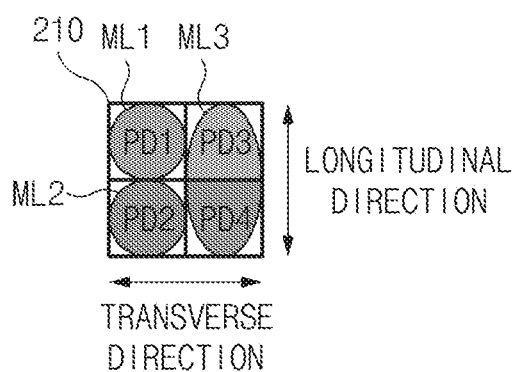
Figure 2D:
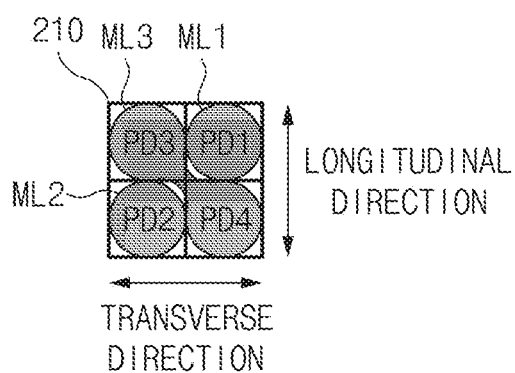

FIGS. 2B, 2C, and 2D illustrate array structures of sub-pixels included in at least one pixel according to various embodiments of the disclosure. For convenience of description, the color filter CF1 covering the first to fourth sub-pixels PD1, PD2, PD3, and PD4 is omitted, and the first to fourth sub-pixels PD1, PD2, PD3, and PD4 and the first to third micro lenses ML1, ML2, and ML3 are illustrated in FIGS. 2B to 2D.

Referring to FIG. 2B, the first to fourth unit sub-pixels PD1, PD2, PD3, and PD4 included in the at least one pixel 210 may be arranged in the shape of a rectangle. In this case, the third sub-pixel PD3 and the fourth sub-pixel PD4 may be disposed to be contiguous to each other in a transverse direction as illustrated in FIG. 2B. Referring to FIG. 2C, the third sub-pixel PD3 and the fourth sub-pixel PD4 may be disposed to be contiguous to each other in a longitudinal direction. Referring to FIG. 2D, the third sub-pixel PD3 and the fourth sub-pixel PD4 may be disposed to be contiguous to each other in a diagonal direction.

According to an embodiment, an image sensor (e.g., the image sensor 200 of FIG. 2A) may include at least one pixel that includes a first sub-pixel (e.g., the first sub-pixel PD1 of FIG. 2A), a second sub-pixel (e.g., the second sub-pixel PD2 of FIG. 2A), a third sub-pixel (e.g., the third sub-pixel PD3 of FIG. 2A), and a fourth sub-pixel (e.g., the fourth sub-pixel PD4 of FIG. 2A) covered by a color filter (e.g., the color filter CF1 of FIG. 2A) and includes a first micro lens (e.g., the first micro lens ML1 of FIG. 2A) covering the first sub-pixel, a second micro lens (e.g., the second micro lens ML2 of FIG. 2A) covering the second sub-pixel, and a third micro lens (e.g., the third micro lens ML3 of FIG. 2A) covering the third sub-pixel and the fourth sub-pixel, and a control circuit (e.g., the control circuit 220 of FIG. 2A) that is electrically connected with the at least one pixel. The control circuit may obtain a light of an external object by using the at least one pixel, may generate depth data associated with the external object, by using data obtained from the third sub-pixel and the fourth sub-pixel through the third micro lens, may generate pixel data on the at least one pixel by processing data obtained from the first sub-pixel, the second sub-pixel, the third sub-pixel, and the fourth sub-pixel with regard to the light, and may transmit the pixel data and the depth data to an external processor.

The color filter may be formed to transmit a light in a wavelength range corresponding to a green light.

The third sub-pixel and the fourth sub-pixel may be disposed to be contiguous to each other in a transverse direction in the at least one pixel.

The third sub-pixel and the fourth sub-pixel may be disposed to be contiguous to each other in a longitudinal direction in the at least one pixel.

The third sub-pixel and the fourth sub-pixel may be disposed to be contiguous to each other in a diagonal direction in the at least one pixel.

The at least one pixel may include a plurality of pixels, and the third sub-pixel and the fourth sub-pixel included in each of the plurality of pixels may be disposed to be contiguous to each other in a plurality of directions of a transverse direction of each of the pixels, a longitudinal direction of each of the pixels, or a diagonal direction of each of the pixels.

The control circuit may restore third data on the third sub-pixel and fourth data on the fourth sub-pixel, based at least on first data obtained from the first sub-pixel and second data obtained from the second sub-pixel and may generate pixel data on the at least one pixel, including the first data, the second data, the third data, and the fourth data.

The control circuit may perform binning on the data respectively obtained from the first sub-pixel, the second sub-pixel, the third sub-pixel, and the fourth sub-pixel to generate pixel data on the at least one pixel.

Figure 3:
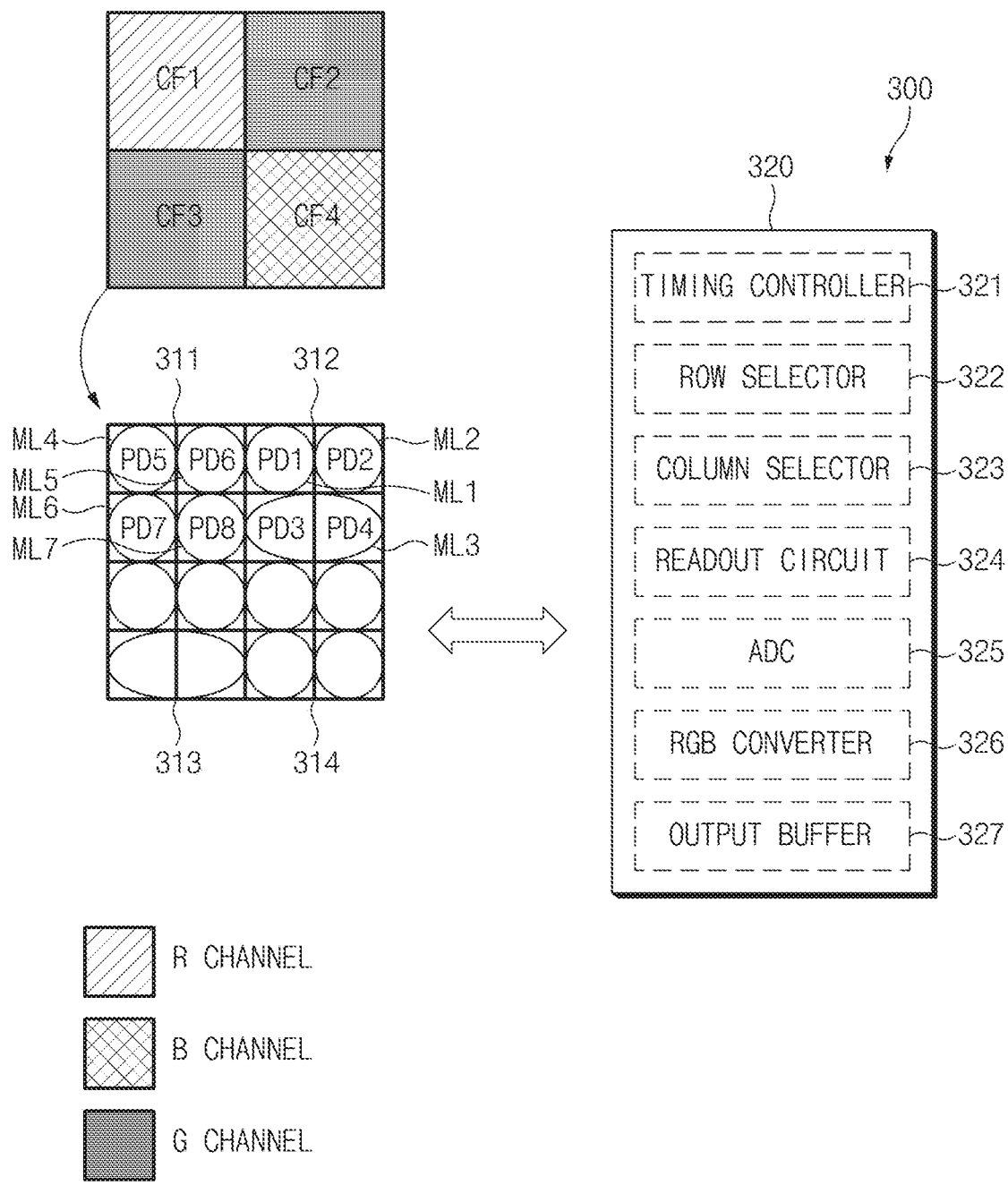
FIG. 3 illustrates an image sensor including a plurality of pixels according to an embodiment of the disclosure.

FIG. 3 illustrates an image sensor including a plurality of pixels according to an embodiment of the disclosure. For convenience of description, a 4×4 pixel array of a plurality of pixels is illustrated in FIG. 3.

Referring to FIG. 3, an image sensor 300 (e.g., the image sensor 200 of FIG. 2A) may include a plurality of pixels 311, 312, 313, and 314 and a control circuit 320 (e.g., the control circuit 220 of FIG. 2A). In an embodiment, the image sensor 300 may not include some of the above components or may further include any other components. For example, the image sensor 300 may further include a memory (not illustrated). In an embodiment, some of the components of the image sensor 300 may be combined to form one entity, which may identically perform functions of the some components before the combination.

The plurality of pixels 311, 312, 313, and 314 may be arranged along a specified channel pattern. The specified channel pattern may be, for example, a Bayer channel pattern in which "R" image data and "G" image data appear alternately at an odd-numbered row line and "G" image data and "B" image data appear alternately at an even-numbered row line. Each pixel (e.g., the pixel 312 or the pixel 210 of FIG. 2A) may include four sub-pixels (e.g., sub-pixels PD1, PD2, PD3, and PD4) (e.g., the first to fourth sub-pixels PD1, PD2, PD3, and PD4 of FIG. 2A), four or three micro lenses ML1, ML2, and ML3 (e.g., the first to third micro lenses ML1, ML2, and ML3 of FIG. 2A) covering the four sub-pixels (e.g., sub-pixels PD1, PD2, PD3, and PD4), and a color filter CF1, CF2, CF3, or CF4 (e.g., the color filter CF1, CF2, CF3, or CF4 of FIG. 2A) disposed between the four sub-pixels (e.g., sub-pixels PD1, PD2, PD3, and PD4) and micro lenses (e.g., the micro lenses ML4, ML5, ML6, and ML7). The color filter CF1, CF2, CF3, or CF4 covering the four sub-pixels (e.g., sub-pixels PD1, PD2, PD3, and PD4) may be an "R" channel color filter CF1 formed to transmit a red light, or may be a "G" channel color filter CF2 or CF3 formed to transmit a green light or a "B" color filter CF4 formed to transmit a blue light. However, the color filter CF1, CF2, CF3, or CF4 included in each pixel (e.g., the pixel 312) may be a color filter complying with the specified channel pattern.

The pixels 312 and 313 (or at least some pixels) corresponding to the "G" channel from among the plurality of pixels 311, 312, 313, and 314 may include three micro lenses ML1, ML2, and ML3, the number of which is less than the number of four sub-pixels (e.g., sub-pixels PD1, PD2, PD3, and PD4) and may include sub-pixels (hereinafter referred to as "phase difference sub-pixels") sharing one micro lens (e.g., the micro lens ML3) and sub-pixels (hereinafter referred to as "adjacent sub-pixels") not sharing a micro lens ML1, ML2, or ML3 contiguous to the phase difference sub-pixels (e.g., the sub-pixels PD3 and PD4). The phase difference sub-pixels (e.g., sub-pixels PD3 and PD4) may be disposed to be contiguous to each other in at least one of a transverse direction, a longitudinal direction, or a diagonal direction of each pixel 312.

The pixel 311 corresponding to the "R" channel from among the plurality of pixels 311, 312, 313, and 314 may include four micro lenses (e.g., the micro lenses ML4, ML5, ML6, and ML7) respectively corresponding to sub-pixels (e.g., the sub-pixels PD5, PD6, PD7, and PD8). Also, the pixel 314 corresponding to the "B" channel may include four micro lenses respectively corresponding to four sub-pixels.

The control circuit 320 may include a timing controller 321, a row selector 322, a column selector 323, a readout circuit 324, an analog-to-digital converter (ADC) 325, an red-green-blue (RGB) converter 326, and an output buffer 327. The timing controller 321 may generate a control signal for controlling an operation of at least one of the row selector 322, the column selector 323, the readout circuit 324, the ADC 325, the RGB converter 326, and the output buffer 327. The row selector 322 may selectively activate one of row lines of the plurality of pixels 311, 312, 313, and 314 depending on the control signal of the timing controller 321. The column selector 323 may selectively activate one of column lines of the plurality of pixels 311, 312, 313, and 314 depending on the control signal of the timing controller 321. The readout circuit 324 may read out (or obtain) data from selected pixels of the plurality of pixels 311, 312, 313, and 314 depending on the control signal of the timing controller 321. The ADC 325 may convert analog pixel data obtained from the plurality of pixels 311, 312, 313, and 314 into digital pixel data. The RGB converter 326 may rearrange the digital pixel data, which does not correspond to a specified channel pattern, to correspond to the specified channel pattern and may generate image data having the specified channel pattern as a result of the rearrangement. The output buffer 327 may buffer the image data corresponding to the specified channel pattern, for example, in units of a frame. The control circuit 320 described below indicates the timing controller 321 and each component controlled by the timing controller 321.

The control circuit 320 may generate phase difference data associated with an external object by using data (e.g., an incident light quantity) that is obtained from phase difference sub-pixels (e.g., the sub-pixels PD3 and PD4). For example, the control circuit 320 may verify (e.g., calculate) a difference between pieces of data respectively obtained from the third sub-pixel PD3 and the fourth sub-pixel PD4, which share the third micro lens ML3, and may generate phase difference data based on the verified difference. The control circuit 320 may generate phase difference data corresponding to all phase difference sub-pixels included in the plurality of pixels 311, 312, 313, and 314.

The control circuit 320 may generate phase difference data based on data obtained from sub-pixels included in each pixel (e.g., the pixel 312) and may process the obtained data to generate pixel data for each pixel. The control circuit 320 may differently process data obtained from each pixel (e.g., the pixel 312) depending on an output mode and may generate pixel data according to the output mode.

According to an embodiment, the control circuit 320 may perform binning (e.g., summing or averaging) on data obtained from sub-pixels (e.g., the sub-pixels PD1, PD2, PD3, and PD4) included in each pixel (e.g., the pixel 312) in the first output mode (e.g., the binning mode) and may generate one pixel data for each pixel (e.g., the pixel 312). According to an embodiment, the control circuit 320 may generate pixel data for each pixel (e.g., the pixel 312), based on data obtained from sub-pixels (e.g., sub-pixels PD1, PD2, PD3, and PD4) included in each pixel (e.g., the pixel 312) in the second output mode (e.g., the rearrangement mode). As data obtained from the phase difference sub-pixels (e.g., the sub-pixels PD3 and PD4) have a phase difference due to one micro lens (e.g., the micro lens ML3) covering the phase difference sub-pixels, a difference may exist between the obtained data and actual image data. To solve an error of image data due to the difference, the control circuit 320 may restore data on the phase difference sub-pixels based on the data obtained from adjacent sub-pixels (e.g., the sub-pixels PD1 and PD2) contiguous to the phase difference sub-pixels (e.g., the sub-pixels PD3 and PD4) in the second output mode. For example, the control circuit 320 may sum the data respectively obtained from the phase difference sub-pixels PD3 and PD4 to generate summed data and may verify a ratio between the adjacent sub-pixels PD1 and PD2. The control circuit 320 may restore data on the phase difference sub-pixels PD3 and PD4 by dividing the summed data to correspond to the verified ratio. In the above embodiment, because data obtained from phase difference sub-pixels are restored based on data obtained from adjacent sub-pixels corresponding to a color channel in which the phase difference sub-pixels are included, the control circuit 320 may restore pixel data on the phase difference sub-pixels to be similar to actual image data. According to various embodiments, the control circuit 320 may restore data of phase difference sub-pixels only when outputting image data exceeding a specified resolution. The specified resolution may be a resolution requiring pixel data of a phase difference sub-pixel when the image data are generated. For example, in the case where the image sensor 300 is composed of 4M pixels each including sub-pixels, the specified resolution may be 4M.

The control circuit 320 may combine the generated pixel data to generate image data having a specified channel pattern. In the second output mode, the control circuit 320 may rearrange pixel data of a sub-pixel unit depending on a specified channel pattern (re-mosaic) and may generate image data having the specified channel pattern. The control circuit 320 may generate image data having the specified channel pattern by exchanging left and right pixel data, top and bottom pixel data, or diagonal pixel data in rearranging pixel data of a sub-pixel unit. The control circuit 320 may transmit the generated phase difference data and the pixel data (including pixel data) to an external processor.

According to various embodiments, the image sensor 300 may generate image data of some pixels of the plurality of pixels 311, 312, 313, and 314 and may transmit the generated image data to the external processor. For example, in the case where information about some pixels corresponding to a zoom region from among the plurality of pixels 311, 312, 313, and 314 is received from the external processor due to adjustment of a zoom ratio, the image sensor 300 may generate pixel data based on data obtained from the some pixels and may transmit the image data including the pixel data to the external processor.

According to various embodiments, the image sensor 300 may include phase difference detection pixels in a pixel corresponding to the "R" channel and a pixel corresponding to the "B" channel. In this case, phase difference data may be denser.

According to the above embodiment, the image sensor 300 may generate image data of a resolution corresponding to the overall number of sub-pixels (e.g., photodetectors). Also, the image sensor 300 may restore data on phase difference sub-pixels by using data obtained from sub-pixels adjacent to the phase difference sub-pixels, thus preventing a decrease in the quality of image due to the phase difference sub-pixels.

According to an embodiment, an image sensor (e.g., the image sensor 300 of FIG. 3) may include a plurality of pixels (e.g., the plurality of pixels 311, 312, 313, and 314 of FIG. 3) arranged depending on a specified channel pattern, wherein each of the plurality of pixels includes one color filter (e.g., the color filter CF1, CF2, CF3, or CF4 of FIG. 3), and a first sub-pixel (e.g., the first sub-pixel PD1 or PD5 of FIG. 3), a second sub-pixel (e.g., the second sub-pixel PD2 or PD6 of FIG. 3), a third sub-pixel (e.g., the third sub-pixel PD3 or PD7 of FIG. 3, and a fourth sub-pixel (e.g., the fourth sub-pixel PD4 or PD8 of FIG. 3) covered by the color filter, and a control circuit (e.g., the control circuit 320 of FIG. 3) that controls the plurality of pixels. Each of at least some pixels (e.g., at least some pixels 312 of FIG. 3) of the plurality of pixels may further include a first micro lens (e.g., the first micro lens ML1 of FIG. 3) covering the first sub-pixel (e.g., the first sub-pixel PD1 of FIG. 3), a second micro lens (e.g., the second micro lens ML2 of FIG. 3) covering the second sub-pixel (e.g., the second sub-pixel PD2 of FIG. 3), and a third micro lens (e.g., the third micro lens ML3 of FIG. 3) covering the third sub-pixel (e.g., the third sub-pixel PD3 of FIG. 3) and the fourth sub-pixel (e.g., the fourth sub-pixel PD4 of FIG. 3). The control circuit may obtain a light of an external object by using the plurality of pixels, may generate depth data associated with the external object, by using data obtained from the third sub-pixel and the fourth sub-pixel included in each of the at least some pixels, may generate pixel data on each of the pixels by using data obtained from the first to fourth sub-pixels included in each of the plurality of pixels, and may transmit the pixel data and the depth data to an external processor.

The color filter included in the at least some pixels may be formed to transmit a light in a wavelength range corresponding to a green light.

The third sub-pixel and the fourth sub-pixel may be disposed to be contiguous to each other in at least one of a transverse direction of each of the at least some pixels, a longitudinal direction of each of the at least some pixels, or a diagonal direction of each of the at least some pixels.

The control circuit may restore data on the third sub-pixel and data on the fourth sub-pixel, based on data obtained from the first sub-pixel and data obtained from the second sub-pixel and may generate pixel data on each of the at least some pixels based on the restored data and the data obtained from the first sub-pixel and the second sub-pixel.

The control circuit may perform binning on the data respectively obtained from the first sub-pixel, the second sub-pixel, the third sub-pixel, and the fourth sub-pixel to generate pixel data on each of the at least some pixels.

Figure 4:
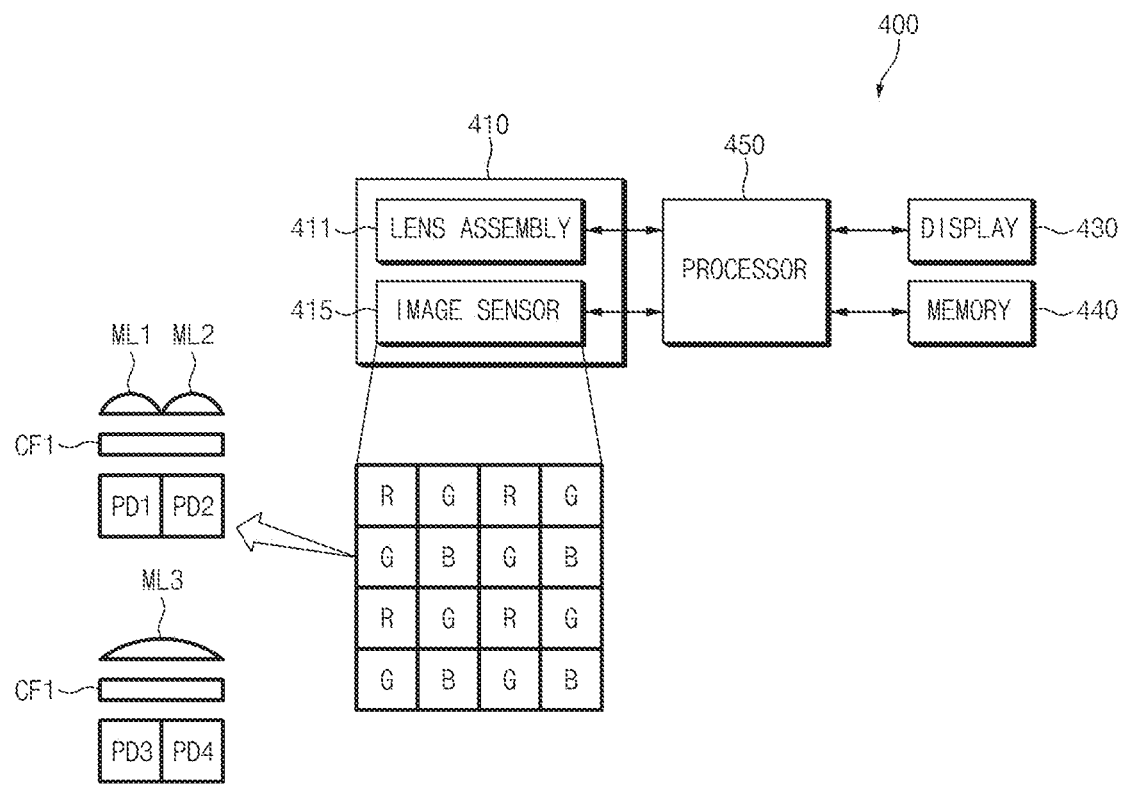
FIG. 4 illustrates a configuration diagram of an electronic device according to an embodiment of the disclosure.

FIG. 4 illustrates a configuration diagram of an electronic device according to an embodiment of the disclosure.

Referring to FIG. 4, an electronic device 400 (e.g., the electronic device 100 of FIG. 1) may include a camera module 410 (e.g., the camera module 110 of FIG. 1), a display 430 (e.g., the display 120 of FIG. 1), and a processor 450. In an embodiment, the electronic device 400 may not include some of the above components or may further include any other components. For example, the electronic device 400 may further include a memory 440. In an embodiment, some of the components of the electronic device 400 may be combined to form one entity, which may identically perform functions of the some components before the combination.

According to an embodiment, the camera module 410 may include a lens assembly 411 including one or more lenses and an image sensor 415.

The lens assembly 411 may be disposed on/over the image sensor 415, and may collect a light output from or reflected by an external object to be transferred to pixels of the image sensor 415.

The image sensor 415 (e.g., the image sensor 300 of FIG. 3) may be disposed under the lens assembly 411 and may generate image data on the external object based on a light passing through the one or more lenses included in the lens assembly 411. The image sensor 415 may include a plurality of pixels (e.g., the plurality of pixels 311, 312, 313, and 314 of FIG. 3) and a control circuit (e.g., the control circuit 320 of FIG. 3) for controlling the plurality of pixels 311, 312, 313, and 314. The configurations of the plurality of pixels 311, 312, 313, and 314 and the control circuit 320 are described with reference to FIG. 3, and thus, additional description will be omitted to avoid redundancy in FIG. 4.

The display 430 may display, for example, various kinds of content (e.g., a text, an image, a video, an icon, and/or a symbol). The display 430 may include, for example, a liquid crystal display (LCD), a light-emitting diode (LED) display, an organic LED (OLED) display, or an electronic paper display. For example, the display 430 may be a touchscreen display.

For example, the memory 440 may store instructions or data associated with at least one other component(s) of the electronic device 400. The memory 440 may be a volatile memory (e.g., a random access memory (RAM) or the like), a nonvolatile memory (e.g., a read only memory (ROM), a flash memory, or the like), or a combination thereof. For example, the memory 440 may store a lookup table including phase difference data corresponding to differences between pieces of data obtained from phase difference sub-pixels (e.g., sub-pixels PD3 and PD4).

The processor 450 may perform data processing or an operation associated with a control and/or a communication of at least one other component(s) of the electronic device 400 by using the instructions stored in the memory 440. The processor 450 may include at least one of a graphic processing unit (GPU), an application processor, or an image signal processor.

According to an embodiment, the processor 450 may generate pixel data on each pixel (e.g., the pixel 312) by using the image sensor 415 and may generate image data based on the pixel data. For example, the processor 450 may obtain data from sub-pixels included in each pixel (e.g., the pixel 312) by using the image sensor 415 and may process the obtained data to generate pixel data on each pixel. The processor 450 may differently generate pixel data on each pixel by controlling an output mode of the image sensor 415. According to an embodiment, in the first output mode (e.g., the binning mode) of the image sensor 415, the processor 450 may perform binning (e.g., summing or averaging) on data obtained from sub-pixels (e.g., sub-pixels PD1, PD2, PD3, and PD4) included in each pixel (e.g., the pixel 312) and may generate one pixel data for each pixel (e.g., the pixel 312). According to an embodiment, in the second output mode (e.g., the rearrangement mode) of the image sensor 415, the processor 450 may generate pixel data of a sub-pixel unit based on data from sub-pixels included in each pixel. In this case, the image sensor 415 may generate four pixel data for each pixel. In the second output mode, the image sensor 415 may restore data on phase difference sub-pixels based on data obtained from adjacent sub-pixels contiguous to the phase difference sub-pixels. For example, by using the image sensor 415, the processor 450 may sum data respectively obtained from the phase difference sub-pixels PD3 and PD4 to generate summed data and may verify a ratio between data obtained from the adjacent sub-pixels PD1 and PD2. By using the image sensor 415, the processor 450 may restore data on the phase difference sub-pixels PD3 and PD4 by dividing the summed data to correspond to the verified ratio. According to various embodiments, the image sensor 415 may restore data on phase difference sub-pixels only in the case of outputting image data exceeding a specified resolution. The specified resolution may be a resolution requiring pixel data of a phase difference sub-pixel when image data are generated. For example, in the case where the image sensor 300 is composed of 4M pixels each including sub-pixels, the specified resolution may be 4M.

The processor 450 may generate image data having a specified channel pattern by combining the generated pixel data by using the image sensor 415. In the second output mode, by using the image sensor 415, the processor 450 may rearrange pixel data of a sub-pixel unit depending on a specified channel pattern (re-mosaic) and may generate image data having the specified channel pattern. For example, the image sensor 415 may generate image data having the specified channel pattern by exchanging left and right pixel data, top and bottom pixel data, or diagonal pixel data in rearranging pixel data of a sub-pixel unit depending on a command of the processor 450. For another example, in the second output mode, the processor 450 may receive pixel data of a sub-pixel unit from the image sensor 415, may rearrange the received pixel data of the sub-pixel unit depending on a specified channel pattern (re-mosaic), and may generate image data having the specified channel pattern.

The processor 450 may display an image generated based on the image data through the display 430. For example, the processor 450 may perform color interpolation on image data such that each pixel of the image data includes "R" information, "G" information, and "B" information and may convert the color-interpolated image data so as to correspond to a specified format (e.g., a YUV format). The processor 450 may generate an image based on the converted image data and may display the generated image through the display 430. Additionally or alternatively, the processor 450 may store the generated image in the memory 440. For example, the processor 450 may store the generated image in the memory 440 in response to an input associated with image photographing.

By using the image sensor 415, the processor 450 may obtain phase difference data associated with an external object based on data obtained from phase difference sub-pixels. The processor 450 may adjust a focus on the external object by moving the lens assembly 411 or the one or more lenses included in the lens assembly 411 based on the phase difference data associated with the external object. For example, the processor 450 may verify a position of the external object to be focused (e.g., a face position of an image in which a character is included), from the image data. When the position of the external object is verified, the processor 450 may determine phase difference sub-pixels, which will be used to adjust a focus, from among phase difference sub-pixels included in the image sensor 415. In this regard, the processor 450 may select phase difference sub-pixels, which are at a position of the external object or are the closest to the position of the external object and will be used to adjust a focus, from among phase difference sub-pixels included in the image sensor 415. The processor 450 may determine phase difference data on the external object by using the determined phase difference sub-pixels and may adjust a focus on the external object by moving the one or more lenses included in the lens assembly 411 based on the determined phase difference data. Additionally or alternatively, the processor 450 may determine distance information of an area corresponding to the determined phase difference sub-pixels based on the determined phase difference data.

According to various embodiments, each pixel (e.g., the pixel 312) may include sub-pixels, the number of which exceeds "4". In the case where the number of sub-pixels changes, the number of micro lenses ML1, ML2, and ML3 may be adjusted to correspond to the number of sub-pixels. However, in the specification, for convenience of description, the case where each pixel (e.g., the pixel 312) includes four sub-pixels is described as an example.

According to the above embodiment, the electronic device 400 may restore data obtained from phase difference sub-pixels based on data obtained from adjacent sub-pixels belonging to a channel in which phase difference sub-pixels included in the image sensor 415 are included, thus preventing a decrease in the quality of image due to the phase difference sub-pixels.

According to an embodiment, an electronic device (e.g., the electronic device 400 of FIG. 4) may include a camera module (e.g., the camera module 410 of FIG. 4), wherein the camera module includes a lens assembly (e.g., the lens assembly 411 of FIG. 4) including one or more lenses and an image sensor (e.g., the image sensor 415 of FIG. 4) including at least one pixel (e.g., the pixels 311, 312, 313, and 314 of FIG. 3), a display (e.g., the display 430 of FIG. 4), and a processor (e.g., the processor 450 of FIG. 4) that is electrically connected with the display and the camera module. The at least one pixel may include a first sub-pixel (e.g., sub-pixel PD1 of FIG. 4), a second sub-pixel (e.g., sub-pixel PD2 of FIG. 4), a third sub-pixel (e.g., sub-pixel PD3 of FIG. 4), and a fourth sub-pixel (e.g., sub-pixel PD4 of FIG. 4) covered by one color filter (e.g., the color filter CF1 of FIG. 4) and may include a first micro lens covering the first sub-pixel, a second micro lens covering the second sub-pixel, and a third micro lens covering the third sub-pixel and the fourth sub-pixel. The processor may obtain a light of an external object passing through the one or more lenses by using the at least one pixel, may generate depth data (phase difference data) associated with the external object, based on data obtained from the third sub-pixel and the fourth sub-pixel through the third micro lens, by using the image sensor, may generate pixel data on the at least one pixel based on the data obtained from the first sub-pixel, the second sub-pixel, the third sub-pixel, and the fourth sub-pixel, by using the image sensor, may display an image generated based on the pixel data through the display, and may adjust a focus on the external object by moving the one or more lenses based on the depth data.

The third sub-pixel and the fourth sub-pixel may be disposed to be contiguous to each other in a transverse direction in the at least one pixel.

The third sub-pixel and the fourth sub-pixel may be disposed to be contiguous to each other in a longitudinal direction in the at least one pixel.

The third sub-pixel and the fourth sub-pixel may be disposed to be contiguous to each other in a diagonal direction in the at least one pixel.

The at least one pixel may include a plurality of pixels, and the third sub-pixel and the fourth sub-pixel included in each of the plurality of pixels may be disposed to be contiguous to each other in a plurality of directions of a transverse direction of each of the pixels, a longitudinal direction of each of the pixels, or a diagonal direction of each of the pixels.

The processor may restore third data on the third sub-pixel and fourth data on the fourth sub-pixel, based at least on first data obtained from the first sub-pixel and second data obtained from the second sub-pixel, by using the image sensor, and may generate pixel data on the at least one pixel, including the first data, the second data, the third data, and the fourth data, by using the image sensor.

The processor may perform binning on the data respectively obtained from the first sub-pixel, the second sub-pixel, the third sub-pixel, and the fourth sub-pixel to generate pixel data on the at least one pixel, by using the image sensor.

Figure 5A:
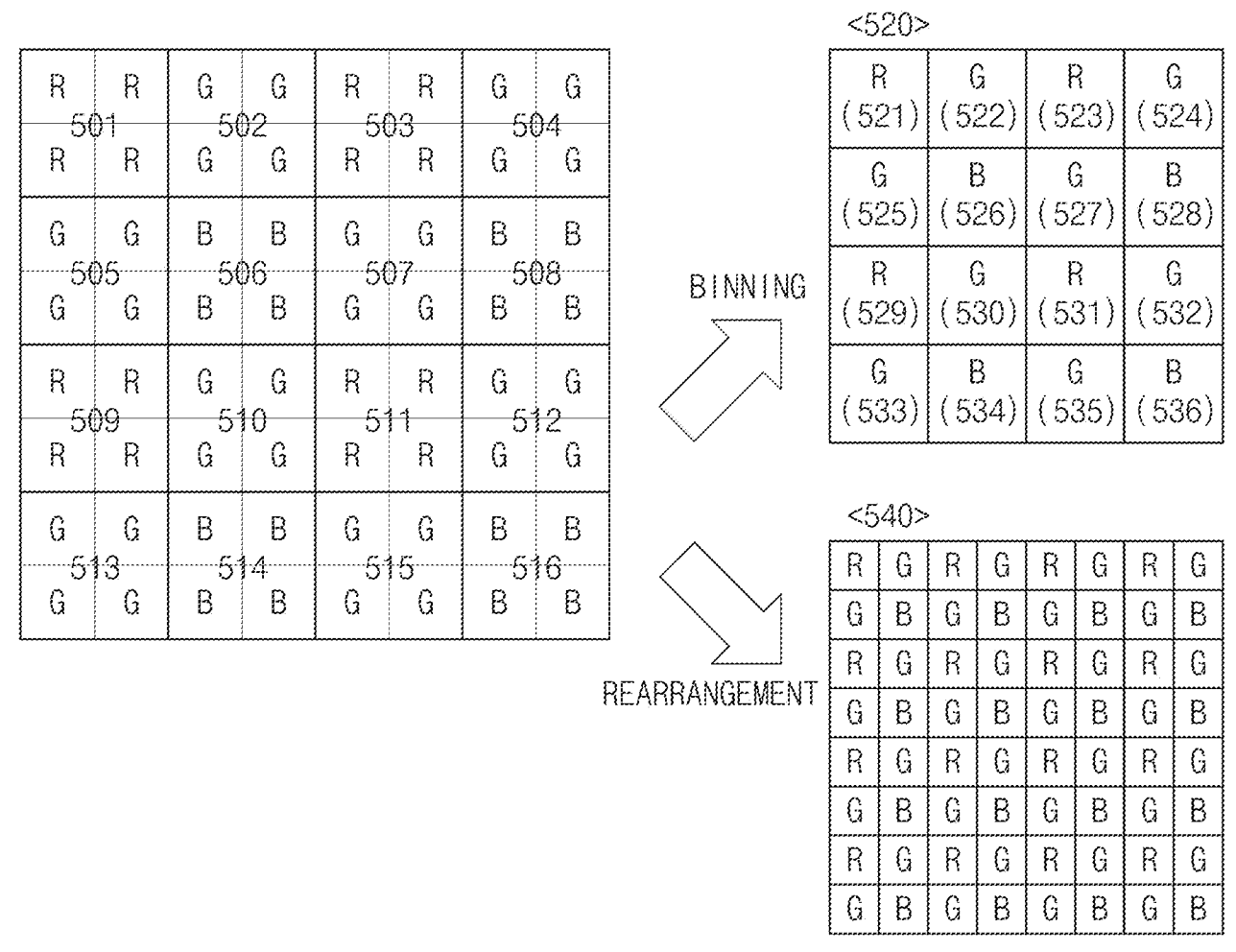
Figure 5B:
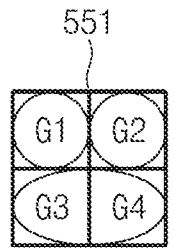
FIG. 5B illustrates an example of data restoration of phase difference sub-pixels according to an embodiment of the disclosure.
Figure 5C:
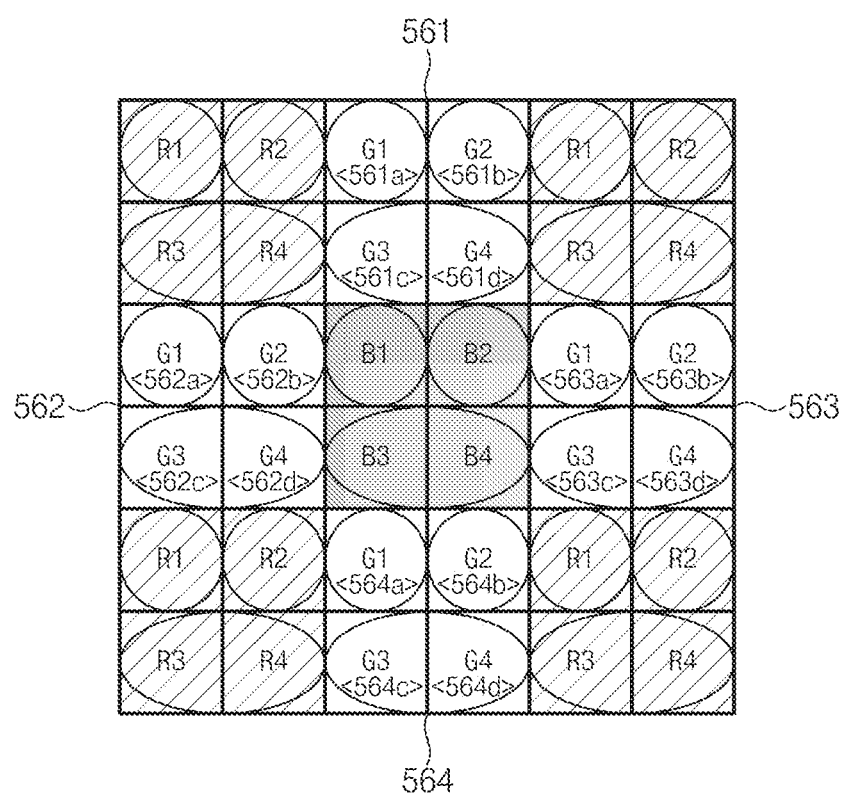
FIG. 5C illustrates another example of data restoration of phase difference sub-pixels according to an embodiment of the disclosure.

FIG. 5A illustrates a binning and rearrangement of pixel data according to an embodiment, FIG. 5B illustrates an example of data restoration of phase difference sub-pixels according to an embodiment, and FIG. 5C illustrates another example of data restoration of phase difference sub-pixels according to an embodiment.

Referring to FIG. 5A, an image sensor (e.g., the image sensor 415 of FIG. 4) may include a plurality of pixels 501 to 516 arranged in a 4×4 array depending on a specified channel pattern. Each of the pixels 501 to 516 may include 2×2 sub-pixels.

According to an embodiment, in the first output node, the image sensor 415 may generate one pixel data 521 for each pixel by performing binning on data obtained sub-pixels included in each pixel (e.g., a pixel corresponding to the "R" channel, the "G" channel, or the "B" channel) in units of a pixel. For example, the image sensor 415 may generate one "R" pixel data 521 by performing binning on data obtained from four sub-pixels corresponding to an "R" channel 501 and may generate one "G" pixel data 522 by performing binning on data obtained from four sub-pixels corresponding to a "G" channel 502. In this manner, the image sensor 415 may generate pixel data 523 to 526 by performing binning on data obtained from four sub-pixels included in each of the remaining pixels 503 to 516. Because the plurality of pixels 501 to 516 are arranged depending on the specified channel pattern, the image sensor 415 may generate image data 520 having the specified channel pattern by sequentially arranging the pixel data 521 to 536 to be combined into a single frame.

In the second output mode, the image sensor 415 may generate pixel data 520 (e.g., pixel data corresponding to the number of sub-pixels) of a sub-pixel unit based on data obtained from respective sub-pixels. For example, the image sensor 415 may generate the image data 540 by performing analog-to-digital conversion on data obtained from respective sub-pixel, rearranging the converted data to correspond to the specified channel pattern to generate pixel data corresponding to the number of sub-pixels, and combining the generating pixel data into a single frame. For example, the image sensor 415 may process image data to have the specified channel pattern, by exchanging positions of pixel data of sub-pixels or using a pixel value (e.g., averaging) of pixel data on the same channel close thereto.

Before rearranging the converted data to correspond to the specified channel pattern, the image sensor 415 may restore data on phase difference sub-pixels (e.g., sub-pixels PD3 and PD4) based on data obtained from adjacent sub-pixels (e.g., sub-pixels PD1 and PD2) placed adjacent to the phase difference sub-pixels (e.g., sub-pixels PD3 and PD4) and may generate the image data 540 based on the restored data.

Referring to FIG. 5B, the image sensor 415 may sum data obtained from phase difference sub-pixels G3 and G4 corresponding to a first channel 551 to generate summed data and may verify a ratio between adjacent sub-pixels G1 and G2 corresponding to the first channel 551. The image sensor 415 may restore data on the phase difference sub-pixels G3 and G4 by dividing the summed data to correspond to the verified ratio.

Referring to FIG. 5C, the image sensor 415 may use data on adjacent sub-pixels 561a and 561b of phase difference sub-pixels 561c and 561d corresponding to a first channel 561 and data on adjacent sub-pixels 562a, 562b, 563a, 563b, 564a, and 564b corresponding to peripheral channels 562, 563, and 564 of the same color as the first channel 561 for the purpose of restoring data on phase difference sub-pixels 561c and 561d corresponding to a first channel 561. For example, the image sensor 415 may restore data on the phase difference sub-pixels 561c and 561d corresponding to the first channel 561 by using a ratio between first summing data obtained from first sub-pixels 561a, 562a, 563a, and 564a corresponding to the first channel 561 and the peripheral channels 562, 563, and 564 and second summing data of summing data obtained from second sub-pixels 561b, 562b, 563b, and 564b corresponding to the first channel 561 and the peripheral channels 562, 563, and 564. For another example, the image sensor 415 may apply a weight to each of pieces of data obtained from the first sub-pixels 561a, 562a, 563a, and 564a and the second sub-pixels 561b, 562b, 563b, and 564b and may restore data on phase difference sub-pixels 561c and 561d corresponding to the first channel 561 based on a ratio between summing data of the weight-applied data of the first sub-pixels 561a, 562a, 563a, and 564a and summing data of the weight-applied data of the second sub-pixels 561b, 562b, 563b, and 564b. A magnitude of a weight to be applied may be greater based on a distance between the phase difference sub-pixels 561c and 561d to be restored and the first sub-pixels 561a, 562a, 563a, and 564a or the second sub-pixels 561b, 562b, 563b, and 564b.

Figure 6:
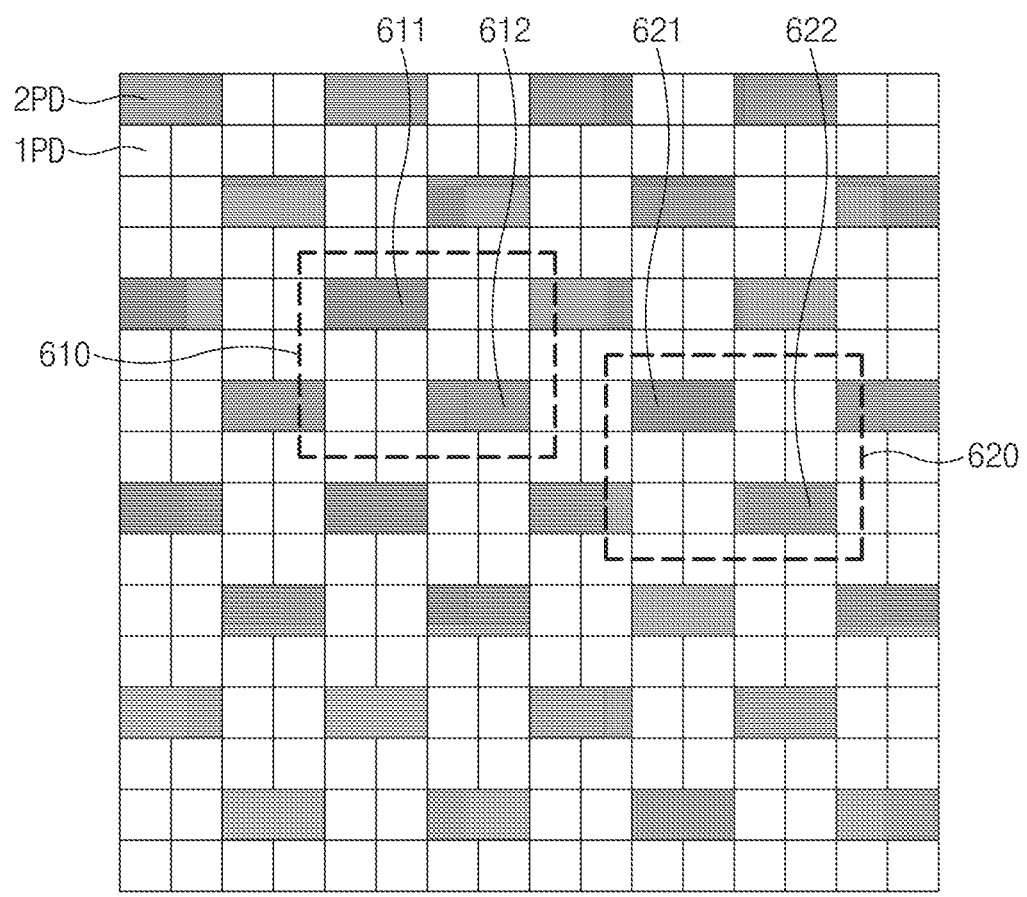
FIG. 6 is a diagram illustrating sub-pixels of an image sensor that sense a light corresponding to first and second external objects according to an embodiment of the disclosure.

FIG. 6 is a diagram illustrating sub-pixels of an image sensor that sense a light corresponding to first and second external objects according to an embodiment of the disclosure.

Below, a method of adjusting a focus based on phase difference data will be described with reference to FIG. 6. FIG. 6 is a diagram illustrating sub-pixels of an image sensor (e.g., the image sensor 415 of FIG. 3), at which a light corresponding to first and second external objects is sensed. In FIG. 6, each quadrangle (e.g., 1PD) may indicate a non-phase difference sub-pixel, and a hatched rectangle (e.g., 2PD) may illustrate a phase difference sub-pixel.

Referring to FIG. 6, based on data obtained from at least some phase difference sub-pixels of phase difference sub-pixels included in the image sensor 415, the processor 450 may generate phase difference data associated with a partial area (or pixels) 610 (hereinafter referred to as a "first external object area 610") of the image sensor 415 corresponding to a first external object and a partial area (or pixels) 620 (hereinafter referred to as a "second external object area 620") of the image sensor 415 corresponding to a second external object. For example, the processor 450 may obtain phase difference data on the first external object area 610 based on data obtained from phase difference sub-pixels 611 and 612 at which a light corresponding to the first external object area 610 is sensed and may move the one or more lenses included in the lens assembly 411 to a position focusing on the first external object area 610 based on the obtained phase difference data. In this regard, the processor 450 may determine phase difference data on the first external object area 610 by using data obtained at least from the phase difference sub-pixel 611 and the phase difference sub-pixel 612 and may adjust a focus on the first external object area 610 (or a first external object) by moving the one or more lenses included in the lens assembly 411 by using the phase difference data on the first external object area 610. The processor 450 may determine distance information of the first external object area 610 (or the first external object) by using the phase difference data on the first external object area 610. For another example, the processor 450 may determine phase difference data on the second external object area 620 by using data obtained at least from the phase difference sub-pixels 621 and 622 corresponding to the second external object area 620. The processor 450 may determine distance information of the second external object area 620 (or the second external object) by using the phase difference data on the second external object area 620 thus determined.

Figure 7:
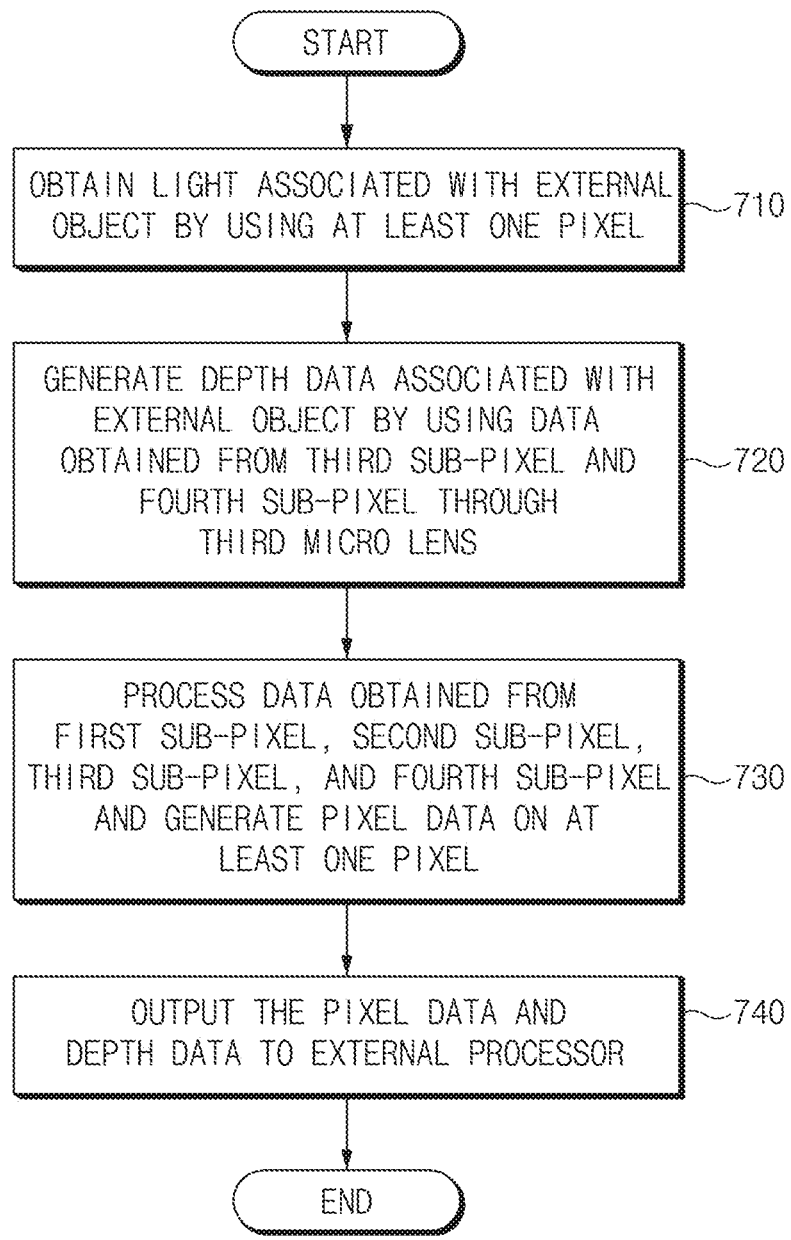
FIG. 7 illustrates a flowchart of a method for operating an image sensor according to an embodiment of the disclosure.

FIG. 7 illustrates a flowchart of a method for operating an image sensor according to an embodiment of the disclosure.

Referring to FIG. 7, in operation 710, a control circuit (e.g., the control circuit 220 of FIG. 2A) may obtain a light associated with an external object by using at least one pixel (e.g., the at least one pixel 210 of FIG. 2A). For example, the control circuit 220 may activate the at least one pixel 210 and may sequentially read out charges accumulated at sub-pixels included in the at least one pixel 210.

In operation 720, the control circuit 220 may generate depth data associated with an external object by using data obtained from the third sub-pixel (e.g., the third sub-pixel PD3 of FIG. 2A) and the fourth sub-pixel (e.g., the fourth sub-pixel PD4 of FIG. 2A) through a third micro lens (e.g., the third micro lens ML3 of FIG. 2A). For example, the control circuit 220 may verify (e.g., calculate) a difference between data (e.g., an incident light quantity) obtained from the third sub-pixel PD3 and data (e.g., an incident light quantity) obtained from the fourth sub-pixel PD4 and may generate depth data of an external object corresponding to the third sub-pixel PD3 and the fourth sub-pixel PD4 based on the verified difference.

In operation 730, the control circuit 220 may process pieces of data respectively obtained from the first sub-pixel PD1, the second sub-pixel PD2, the third sub-pixel PD3, and the fourth sub-pixel PD4 with regard to a light and may generate pixel data on the at least one pixel 210. For example, in the first output mode, the control circuit 220 may generate pixel data on the at least one pixel 210, by binning the data obtained from the first sub-pixel PD1, the second sub-pixel PD2, the third sub-pixel PD3, and the fourth sub-pixel PD4 and performing analog-to-digital conversion on the binned data. For another example, in the second output mode, the control circuit 220 may generate pixel data of a sub-pixel unit by performing analog-to-digital conversion on the data respectively obtained from the first sub-pixel PD1, the second sub-pixel PD2, the third sub-pixel PD3, and the fourth sub-pixel PD4.

In operation 740, the control circuit 220 may output the generated pixel data and the generated depth data to an external processor (e.g., the processor 450 of FIG. 4). In the case of the pixel data of the sub-pixel unit, the control circuit 220 may rearrange the pixel data and may transmit the rearranged pixel data to the external processor 450.

Figure 8:
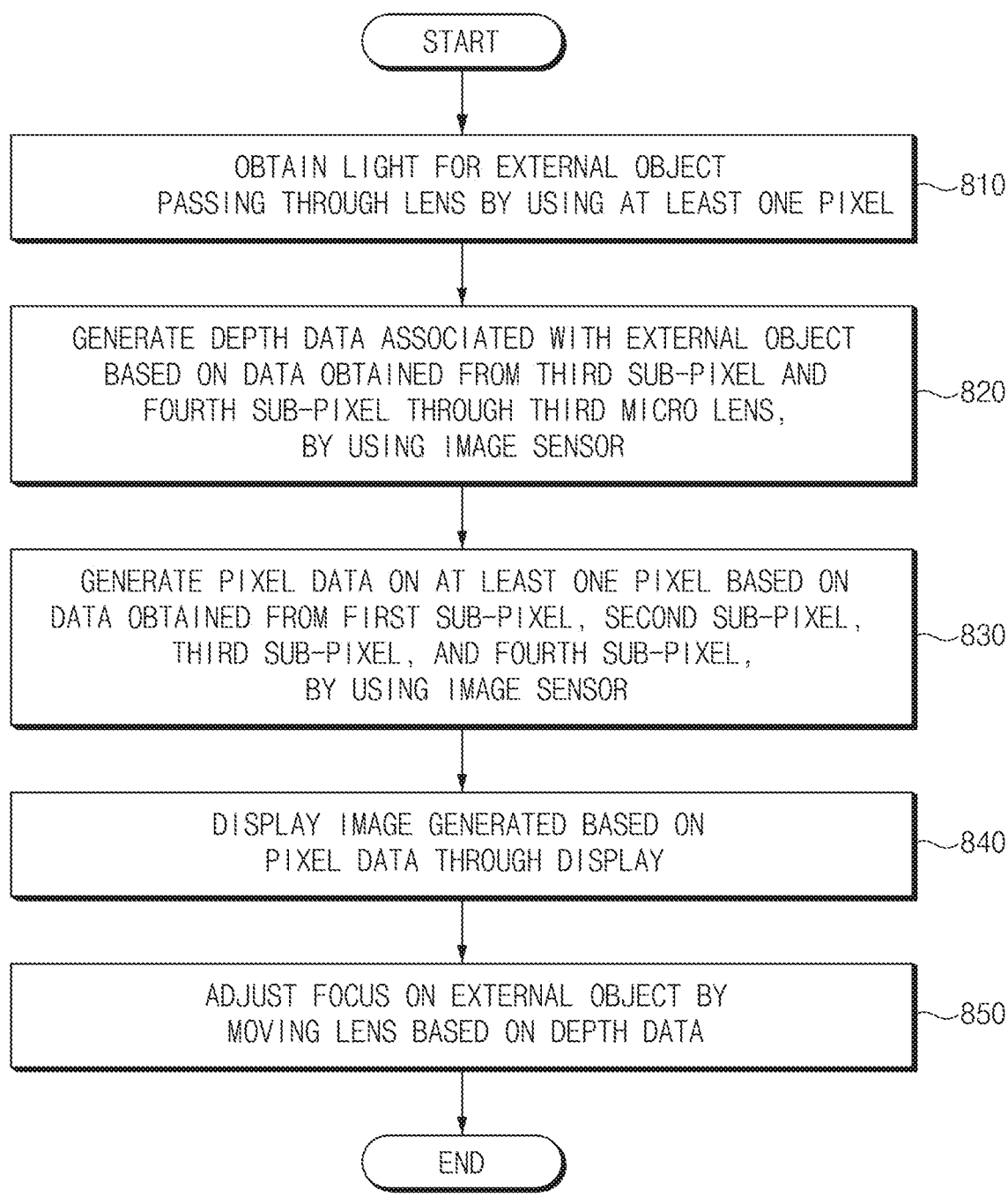
FIG. 8 illustrates a flowchart of a method for adjusting focus according to an embodiment of the disclosure.

FIG. 8 illustrates a flowchart of a method for adjusting focus according to an embodiment of the disclosure.

Referring to FIG. 8, in operation 810, a processor (e.g., the processor 450 of FIG. 4) may obtain a light for an external object passing through the lens (e.g., one or more lenses included in the lens assembly 411 of FIG. 4) by using the at least one pixel 210. For example, the processor 450 may control an image sensor (e.g., the image sensor 415 of FIG. 4) to activate the at least one pixel 210 and may sequentially read out charges accumulated at sub-pixels included in the at least one pixel 210.

In operation 820, the processor 450 may generate depth data associated with an external object based on data obtained from the third sub-pixel PD3 and the fourth sub-pixel PD4 through the third micro lens ML3, by using the image sensor 415. For example, the processor 450 may verify (e.g., calculate) a difference between data (e.g., an incident light quantity) obtained from the third sub-pixel PD3 and data (e.g., an incident light quantity) obtained from the fourth sub-pixel PD4 and may generate depth data (e.g., phase difference data) of an external object corresponding to the third sub-pixel PD3 and the fourth sub-pixel PD4 based on the verified difference.

In operation 830, the processor 450 may generate pixel data on the at least one pixel based on the pieces of data respectively obtained from the first sub-pixel PD1, the second sub-pixel PD2, the third sub-pixel PD3, and the fourth sub-pixel PD4, by using the image sensor 415. For example, in the first output mode, by using the image sensor 415, the processor 450 may generate pixel data on the at least one pixel 210, by binning the data obtained from the first sub-pixel PD1, the second sub-pixel PD2, the third sub-pixel PD3, and the fourth sub-pixel PD4 and performing analog-to-digital conversion on the binned data. For another example, in the second output mode, by using the image sensor 415, the processor 450 may generate pixel data on a sub-pixel unit, by performing analog-to-digital conversion on the data obtained from the first sub-pixel PD1, the second sub-pixel PD2, the third sub-pixel PD3, and the fourth sub-pixel PD4.

In operation 840, the processor 450 may display an image generated based on the pixel data through the display (e.g., the display 430 of FIG. 4). For example, the processor 450 may perform color interpolation on image data such that each pixel of the image data includes "R" information, "G" information, and "B" information and may convert the color-interpolated image data to correspond to a specified format (e.g., a YUV format). The processor 450 may generate an image based on the converted image data and may display the generated image through a display (e.g., the display 430 of FIG. 4).

In operation 850, the processor 450 may adjust a focus on the external object by moving the one or more lenses based on the depth data associated with the external object. For example, the processor 450 may verify a position of the external object to be focused (e.g., a face position of an image in which a character is included), from the image data. When the position of the external object is verified, the processor 450 may determine phase difference sub-pixels, which will be used to adjust a focus on the external object, from among phase difference sub-pixels included in the image sensor 415. The processor 450 may obtain depth data (phase difference data) on the external object by using data obtained from the determined phase difference sub-pixels and may adjust a focus on the external object by moving the one or more lenses based on the depth data.

Figure 9:
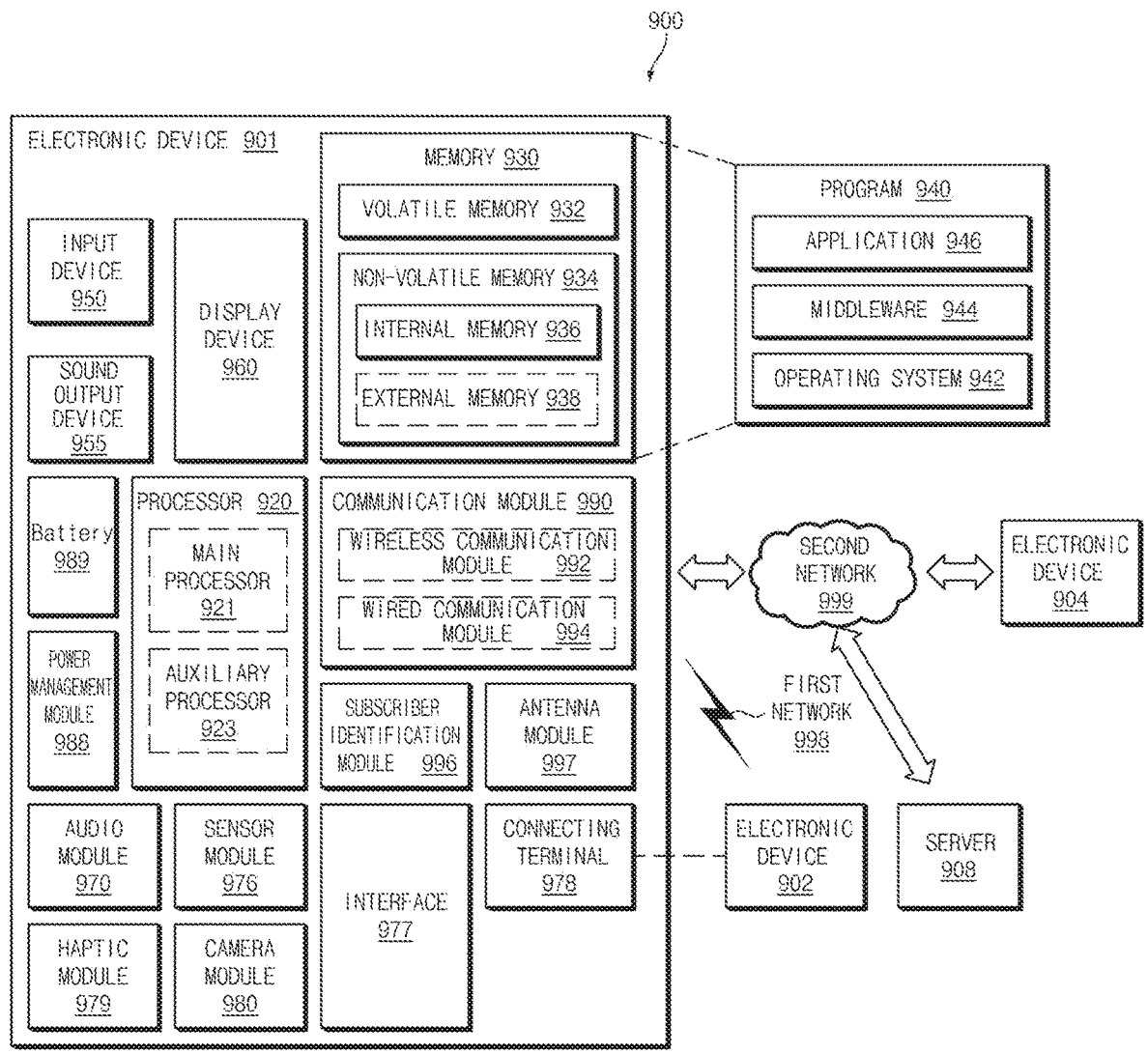
FIG. 9 is a block diagram of an electronic device in a network environment according to an embodiment of the disclosure.

FIG. 9 is a block diagram of an electronic device in a network environment according to an embodiment of the disclosure.

Referring to FIG. 9, an electronic device 901 in a network environment 900 may communicate with an electronic device 902 via a first network 998 (e.g., a short-range wireless communication network), or an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920 (e.g., the processor 450 of FIG. 4), memory 930 (e.g., the memory 440 of FIG. 4), an input device 950, a sound output device 955, a display device 960 (e.g., the display 430 of FIG. 4), an audio module 970, a sensor module 976, an interface 977, a haptic module 979, a camera module 980 (e.g., the image sensor 415 and the lens assembly 411 of FIG. 4), a power management module 988, a battery 989, a communication module 990, a subscriber identification module(SIM) 996, or an antenna module 997. In some embodiments, at least one (e.g., the display device 960 or the camera module 980) of the components may be omitted from the electronic device 901, or one or more other components may be added in the electronic device 901. In some embodiments, some of the components may be implemented as single integrated circuitry. For example, the sensor module 976 (e.g., a fingerprint sensor, an iris sensor, or an illuminance sensor) may be implemented as embedded in the display device 960 (e.g., a display).

The processor 920 may execute, for example, software (e.g., a program 940) to control at least one other component (e.g., a hardware or software component) of the electronic device 901 coupled with the processor 920, and may perform various data processing or computation. According to one embodiment, as at least part of the data processing or computation, the processor 920 may load a command or data received from another component (e.g., the sensor module 976 or the communication module 990) in a volatile memory 932, process the command or the data stored in the volatile memory 932, and store resulting data in a non-volatile memory 934. According to an embodiment, the processor 920 may include a main processor 921 (e.g., a central processing unit (CPU) or an application processor (AP)), and an auxiliary processor 923 (e.g., a GPU, an image signal processor (ISP), a sensor hub processor, or a communication processor (CP)) that is operable independently from, or in conjunction with, the main processor 921. Additionally or alternatively, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display device 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to an embodiment, the auxiliary processor 923 (e.g., an image signal processor or a communication processor) may be implemented as part of another component (e.g., the camera module 980 or the communication module 990) functionally related to the auxiliary processor 923.

The memory 930 may store various data used by at least one component (e.g., the processor 920 or the sensor module 976) of the electronic device 901. The various data may include, for example, software (e.g., the program 940) and input data or output data for a command related therer to. The memory 930 may include the volatile memory 932 or the non-volatile memory 934.

The program 940 may be stored in the memory 930 as software, and may include, for example, an operating system (OS) 942, middleware 944, or an application 946.

The input device 950 may receive a command or data to be used by other component (e.g., the processor 920) of the electronic device 901, from the outside (e.g., a user) of the electronic device 901. The input device 950 may include, for example, a microphone, a mouse, a keyboard, or a digital pen (e.g., a stylus pen).

The sound output device 955 may output sound signals to the outside of the electronic device 901. The sound output device 955 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 960 may visually provide information to the outside (e.g., a user) of the electronic device 901. The display device 960 may include, for example, a display, a hologram device, or a projector and control circuitry to control a corresponding one of the display, hologram device, and projector. According to an embodiment, the display device 960 may include touch circuitry adapted to detect a touch, or sensor circuitry (e.g., a pressure sensor) adapted to measure the intensity of force incurred by the touch.

The audio module 970 may convert a sound into an electrical signal and vice versa. According to an embodiment, the audio module 970 may obtain the sound via the input device 950, or output the sound via the sound output device 955 or an external electronic device (e.g., an electronic device 902) (e.g., speaker of headphone) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, a HDMI connector, a USB connector, a SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to one embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the AP) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The antenna module 997 may transmit or receive a signal or power to or from the outside (e.g., the external electronic device) of the electronic device 901. According to an embodiment, the antenna module 997 may include an antenna including a radiating element composed of a conductive material or a conductive pattern formed in or on a substrate (e.g., PCB). According to an embodiment, the antenna module 997 may include a plurality of antennas. In such a case, at least one antenna appropriate for a communication scheme used in the communication network, such as the first network 998 or the second network 999, may be selected, for example, by the communication module 990 (e.g., the wireless communication module 992) from the plurality of antennas. The signal or the power may then be transmitted or received between the communication module 990 and the external electronic device via the selected at least one antenna. According to an embodiment, another component (e.g., a radio frequency integrated circuit (RFIC)) other than the radiating element may be additionally formed as part of the antenna module 997.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the electronic devices 902 and 904 may be a device of a same type as, or a different type, from the electronic device 901. According to an embodiment, all or some of operations to be executed at the electronic device 901 may be executed at one or more of the external electronic devices 902, 904, or 908. For example, when the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, or client-server computing technology may be used, for example.

Figure 10:
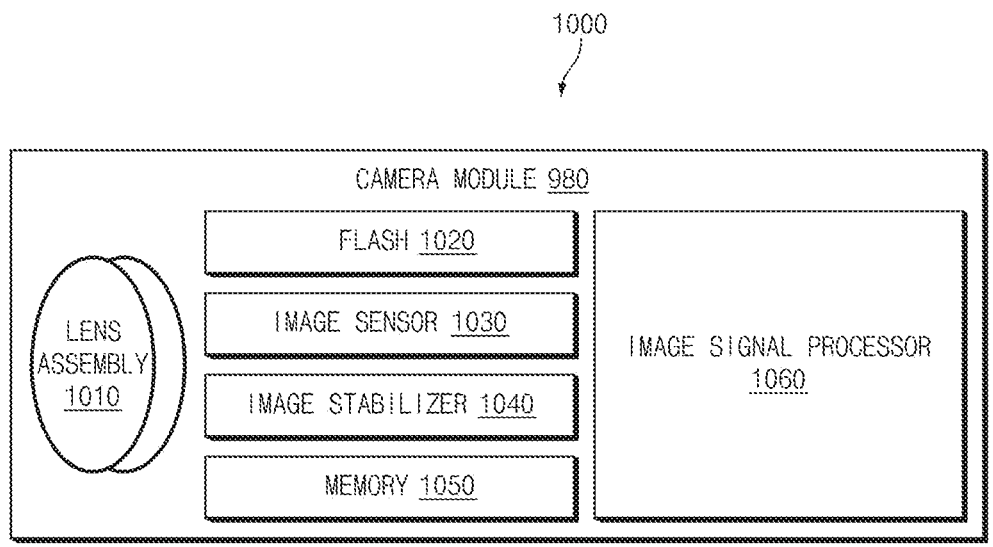
FIG. 10 is a block diagram illustrating a camera module according to an embodiment of the disclosure.

FIG. 10 is a block diagram illustrating a camera module according to an embodiment of the disclosure.

Referring to FIG. 10, the camera module 980 may include a lens assembly 1010 (e.g., the lens assembly 411 of FIG. 4), a flash 1020, an image sensor 1030 (e.g., the image sensor 415 of FIG. 4), an image stabilizer 1040, a memory 1050 (e.g., a buffer memory), or an image signal processor 1060 (e.g., the processor 450 of FIG. 4). The lens assembly 1010 may collect a light emitted from a subject targeted for image photographing. The lens assembly 1010 may include one or more lenses. According to an embodiment, the camera module 980 may include a plurality of lens assemblies 1010. In this case, the camera module 980 may form, for example, a dual camera, a 360-degree camera, or a spherical camera. Some of the plurality of lens assemblies 1010 may have the same lens attributes (e.g., a view angle, a focal length, auto-focusing, an f number, or an optical zoom), or at least one lens assembly may have one or more lens attributes different from those of another lens assembly. The lens assembly 1010 may include, for example, a wide-angle lens or a telephoto lens.

The flash 1020 may emit light that is used to reinforce light emitted or reflected from a subject. According to an embodiment, the flash 1020 may include one or more light emitting diodes (LEDs) (e.g., a RGB LED, a white LED, an IR LED, or an ultraviolet (UV) LED) or a xenon lamp. The image sensor 1030 may obtain an image corresponding to the subject by converting a light transmitted through the lens assembly 1010 after being emitted or reflected from the subject, into an electrical signal. According to an embodiment, the image sensor 1030 may include one selected from image sensors having different attributes, such as an RGB sensor, a black-and-white (BW) sensor, an IR sensor, or an UV sensor, a plurality of image sensors having the same attributes, or a plurality of image sensors having different attributes. Each image sensor included in the image sensor 1030 may be implemented by using, for example, a charged coupled device (CCD) sensor or a complementary metal oxide semiconductor (CMOS) sensor.

In response to the movement of the camera module 980 or the electronic device 901 including the camera module 980, the image stabilizer 1040 may move the image sensor 1030 or at least one lens included in the lens assembly 1010 in a specific direction or may control operation attributes of the image sensor 1030 (e.g., may adjust the readout timing). This makes it possible to compensate for at least part of a negative influence of the movement on an image being photographed. According to an embodiment, the image stabilizer 1040 may sense such a movement of the camera module 980 or the electronic device 901 by using a gyro sensor (not illustrated) or an acceleration sensor (not illustrated) disposed inside or outside the camera module 980. According to an embodiment, the image stabilizer 1040 may be implemented, for example, with an optical image stabilizer. The memory 1050 may at least temporarily store at least a portion of an image obtained through the image sensor 1030 for a next image processing task. For example, when image photographing is delayed due to a shutter operation or multiple images are quickly photographed, a raw (or original) image obtained (e.g., a Bayer-patterned image or a high-resolution image) may be stored in the memory 1050, and a copy image (e.g., a low-resolution image) corresponding to the raw image may be previewed through the display device 960. Afterwards, when a specified condition is satisfied (e.g., when a user's input or system command is received), at least a portion of the raw image stored in the memory 1050 may be obtained and processed, for example, by the image signal processor 1060. According to an embodiment, the memory 1050 may be implemented with at least a portion of the memory 930 or with a separate memory that operates independently of the memory 930.

The image signal processor 1060 may perform one or more image processing on an image obtained through the image sensor 1030 or an image stored in the memory 1050. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 1060 may control at least one (e.g., the image sensor 1030) of the components included in the camera module 980 (e.g., may control an exposure time or a readout timing). An image processed by the image signal processor 1060 may be again stored in the memory 1050 for further processing, or may be provided to an external component (e.g., the memory 930, the display device 960, the electronic device 902, the electronic device 904, or the server 908) of the camera module 980. According to an embodiment, the image signal processor 1060 may be implemented with at least a portion of the processor 920, or with a separate processor that operates independently of the processor 920. In the case where the image signal processor 1060 is implemented with a processor independent of the processor 920, under control of the processor 920, at least one image processed by the image signal processor 1060 may be displayed through the display device 960 as it is or after being further processed.

According to an embodiment, the electronic device 901 may include a plurality of camera modules 980 having different attributes or functions. In this case, at least one of the plurality of camera modules 980 may be, for example, a wide-angle camera, and at least another of the plurality of camera modules 980 may be a telephoto camera. Alternatively, at least one of the plurality of camera modules 980 may be, for example, a front camera, and at least another of the plurality of camera modules 980 may be a rear camera.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 940) including one or more instructions that are stored in a storage medium (e.g., internal memory 936 or external memory 938) that is readable by a machine (e.g., the electronic device 901). For example, a processor(e.g., the processor 920) of the machine (e.g., the electronic device 901) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to embodiments of the disclosure, it may be possible to generate image data of a resolution corresponding to the overall number of photodetectors (or sub-pixels).

Besides, a variety of effects directly or indirectly understood through this disclosure may be provided.

While the disclosure has been shown and described with reference to various embodiments thereof, it will be understood by those skilled in the art that various changes in form and details may be made therein without departing from the scope of the disclosure as defined by the appended claims and their equivalents.

What is claimed is:

1. An electronic device comprising:
   a camera, wherein the camera includes a lens assembly including one or more lenses, an image sensor including at least one pixel,
      wherein the at least one pixel includes a first sub-pixel, a second sub-pixel, a third sub-pixel, and a fourth sub-pixel, and
      wherein the first sub-pixel is covered by a first micro lens, the second sub-pixel is covered by a second micro lens, and the third sub-pixel and the fourth sub-pixel are covered by a third micro lens;
   a display; and
   a processor configured to:
      obtain a light reflected from an external object and permeating through the one or more lenses by using the at least one pixel,
      obtain data from the third sub-pixel and the fourth sub-pixel based on light permeating through the third micro lens and generate depth data associated with the external object,
      obtain data from the first sub-pixel, the second sub-pixel, the third sub-pixel, and the fourth sub-pixel and generate pixel data,
      generate an image based on the pixel data,
      control the display to output the image, and
      move the one or more lenses based on the depth data.

2. The electronic device of claim 1, wherein the third sub-pixel and the fourth sub-pixel are adjacent to each other in a transverse direction of the at least one pixel.

3. The electronic device of claim 1, wherein the third sub-pixel and the fourth sub-pixel are adjacent to each other in a longitudinal direction of the at least one pixel.

4. The electronic device of claim 1, wherein the third sub-pixel and the fourth sub-pixel are adjacent each other in a diagonal direction in the at least one pixel.

5. The electronic device of claim 1,
   wherein the at least one pixel includes a plurality of pixels, and
   wherein the third sub-pixel and the fourth sub-pixel included in each of the plurality of pixels are adjacent to each other in a transverse direction of each of the pixels, a longitudinal direction of each of the pixels, or a diagonal direction of each of the pixels.

6. The electronic device of claim 1, wherein the processor is further configured to:
   control the image sensor to obtain first data from the first sub-pixel and second data from the second sub-pixel,
   control the image sensor to restore third data of the third sub-pixel and fourth data of the fourth sub-pixel based on the first data and the second data, and
   control the image sensor to generate pixel data of the at least one pixel based on the first data, the second data, the third data, and the fourth data.

7. The electronic device of claim 1, wherein the processor is further configured to:
   bin data from the first sub-pixel, the second sub-pixel, the third sub-pixel, and the fourth sub-pixel, and generate pixel data of the at least one pixel.

8. An image sensor comprising:
   at least one pixel including a first sub-pixel, a second sub-pixel, a third sub-pixel, and a fourth sub-pixel, wherein the first sub-pixel is covered by a first micro lens, the second sub-pixel is covered by a second micro lens, and the third sub-pixel and the fourth sub-pixel are covered by a third micro lens; and
   a control circuit configured to:
      obtain a light reflected from an external object,
      obtain data from the third sub-pixel and the fourth sub-pixel based on light permeating through the third micro lens and generate depth data associated with the external object,
      obtain data from the first sub-pixel, the second sub-pixel, the third sub-pixel, and the fourth sub-pixel and generate pixel data; and
      transmit the pixel data and the depth data to an external processor.

9. The image sensor of claim 8, wherein a color filter of the third micro lens is configured to transmit a light having a wavelength corresponding to a green light.

10. The image sensor of claim 8, wherein the third sub-pixel and the fourth sub-pixel are adjacent to each other in a transverse direction in the at least one pixel.

11. The image sensor of claim 8, wherein the third sub-pixel and the fourth sub-pixel are adjacent to each other in a longitudinal direction in the at least one pixel.

12. The image sensor of claim 8, wherein the third sub-pixel and the fourth sub-pixel are adjacent to each other in a diagonal direction in the at least one pixel.

13. The image sensor of claim 8,
   wherein the at least one pixel includes a plurality of pixels, and
   wherein the third sub-pixel and the fourth sub-pixel included in each of the plurality of pixels are adjacent to each other in a transverse direction of each of the pixels, a longitudinal direction of each of the pixels, or a diagonal direction of each of the pixels.

14. The image sensor of claim 8, wherein the control circuit is further configured to:
   control the image sensor to obtain first data from the first sub-pixel and second data from the second sub-pixel,
   restore third data of the third sub-pixel and fourth data of the fourth sub-pixel based at least on the first data and the second data, and
   generate pixel data of the at least one pixel based on the first data, the second data, the third data, and the fourth data.

15. The image sensor of claim 8, wherein the control circuit is configured to:
   binning the data from the first sub-pixel, the second sub-pixel, the third sub-pixel, and the fourth sub-pixel and generate pixel data on the at least one pixel.

16. An image sensor comprising:
   a plurality of pixels arranged based on a specified channel pattern, wherein each of the plurality of pixels includes a first sub-pixel, a second sub-pixel, a third sub-pixel, and a fourth sub-pixel covered by a color filter; and a control circuit configured to control the plurality of pixels, wherein a portion of pixels from the plurality of pixels each includes a first micro lens covering the first sub-pixel, a second micro lens covering the second sub-pixel, and a third micro lens covering the third sub-pixel and the fourth sub-pixel, and wherein the control circuit is further configured to:
control the plurality of pixels to obtain a light reflected by an external object,
obtain data from the third sub-pixel and the fourth sub-pixel included in each of the portion of pixels and generate depth data,
obtain data from the first to fourth sub-pixels included in each of the plurality of pixels and generate pixel data for each of the pixels, and
transmit the pixel data and the depth data to an external processor.

17. The image sensor of claim 16, wherein the color filter is formed to transmit a light having a wavelength corresponding to a green light.

18. The image sensor of claim 16, wherein the third sub-pixel and the fourth sub-pixel are adjacent to each other in at least one of a transverse direction of each of the at least some pixels, a longitudinal direction of each of the at least some pixels, or a diagonal direction of each of the at least some pixels.

19. The image sensor of claim 16, wherein the control circuit is further configured to:
obtain data from the first sub-pixel and the second sub-pixel and restore data of the third sub-pixel and data of the fourth sub-pixel, and
generate pixel data for each of the portion of pixels based on the restored data and the data obtained from the first sub-pixel and the second sub-pixel.

20. The image sensor of claim 16, wherein the control circuit is further configured to:
bin the data obtained from the first sub-pixel, the second sub-pixel, the third sub-pixel, and the fourth sub-pixel and generate pixel data for each of the portion of pixels.

21. The image sensor of claim 16, wherein the third micro lens controls an angle of incident light to focus received light to the third sub-pixel and the fourth sub-pixel.

22. The image sensor of claim 16, wherein the control circuit is further configured to determine a distance between data from the third sub-pixel and the fourth sub-pixel, and generate phase difference data based on the distance.

23. The image sensor of claim 16, wherein the control circuit is further configured to:
select the portion of pixels from the plurality of pixels based on proximity to the external object, and
control one or more lenses based on phase difference data from the portion of pixels.

* * * * *